United States Patent
Sharma et al.

(10) Patent No.: US 11,563,454 B1
(45) Date of Patent: Jan. 24, 2023

(54) SELECTIVE TIME-INTERLEAVED ANALOG-TO-DIGITAL CONVERTER FOR OUT-OF-BAND BLOCKER MITIGATION

(71) Applicant: Amazon Technologies, Inc., Seattle, WA (US)

(72) Inventors: Sunny Sharma, Shoreline, WA (US); Mustansir Yunus Mukadam, Seattle, WA (US); Jae Hong Chang, Bellevue, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/019,011

(22) Filed: Sep. 11, 2020

(51) Int. Cl.
  *H04B 1/10* (2006.01)
  *H03M 1/06* (2006.01)
(52) U.S. Cl.
  CPC ............ *H04B 1/10* (2013.01); *H03M 1/0629* (2013.01)
(58) Field of Classification Search
  CPC ... H03M 1/0629; H03M 1/123; H03M 1/1215
  See application file for complete search history.

(56) References Cited

U.S. PATENT DOCUMENTS

| | | | | |
|---|---|---|---|---|
| 5,745,394 A * | 4/1998 | Tani | .................. | G11C 7/16 341/126 |
| 7,075,471 B1 * | 7/2006 | Gupta | .................. | H03M 1/1215 341/155 |
| 9,793,910 B1 * | 10/2017 | Devarajan | .............. | H03M 1/124 |
| 10,601,434 B1 * | 3/2020 | Molina | ..................... | H04B 1/16 |
| 2005/0229235 A1 * | 10/2005 | Loyer | ................. | H04N 21/4382 725/152 |
| 2006/0239389 A1 * | 10/2006 | Coumou | .................. | H04B 1/10 375/346 |
| 2010/0302082 A1 * | 12/2010 | Brekelmans | ............. | H04B 1/18 341/110 |
| 2010/0322361 A1 * | 12/2010 | Han | ..................... | H04B 1/0025 375/345 |
| 2011/0242428 A1 * | 10/2011 | Blouin | .................... | H04N 5/455 348/726 |
| 2012/0075129 A1 * | 3/2012 | Kidambi | ............. | H03M 1/1052 341/118 |
| 2013/0117790 A1 * | 5/2013 | Coban | .................. | H03M 3/398 725/71 |
| 2014/0146861 A1 * | 5/2014 | Li | .......................... | H03M 9/00 375/219 |
| 2015/0153441 A1 * | 6/2015 | Lapat | ...................... | G01S 7/285 342/175 |

(Continued)

*Primary Examiner* — Aristocratis Fotakis
(74) *Attorney, Agent, or Firm* — Lowenstein Sandler LLP

(57) ABSTRACT

Technologies directed to a receiver circuit with selective time-interleaved analog-to-digital converters (ADCs) are described. The receiver circuit includes a first ADC, a second ADC, and a digital processing circuit coupled to the first ADC and second ADC that operates in a first mode or a second mode. In the first mode the first ADC receives a first signal and generates first samples at a first sampling frequency. The digital processing circuit processes the first samples. In the second mode, the first ADC and the second ADC both receive a second signal and collectively generate second samples at a second sampling frequency that is greater than the first sampling frequency. The digital processing circuit processes the second samples.

19 Claims, 16 Drawing Sheets

(56) References Cited

U.S. PATENT DOCUMENTS

2015/0326853 A1\* 11/2015 Grzelka ................. G01R 23/16
                                                          348/192
2016/0079994 A1\* 3/2016 Lee ....................... H03M 1/123
                                                          341/118

\* cited by examiner

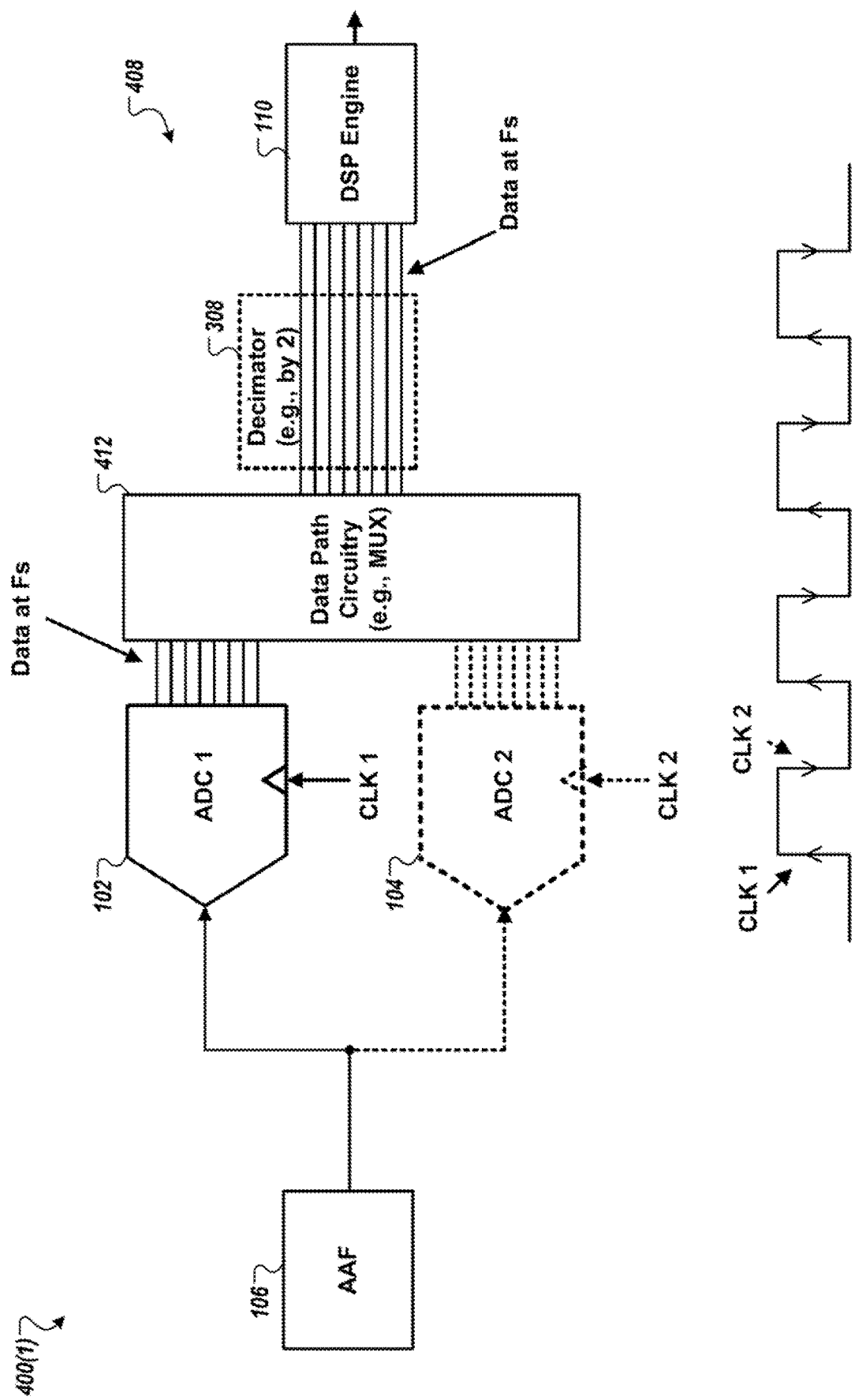

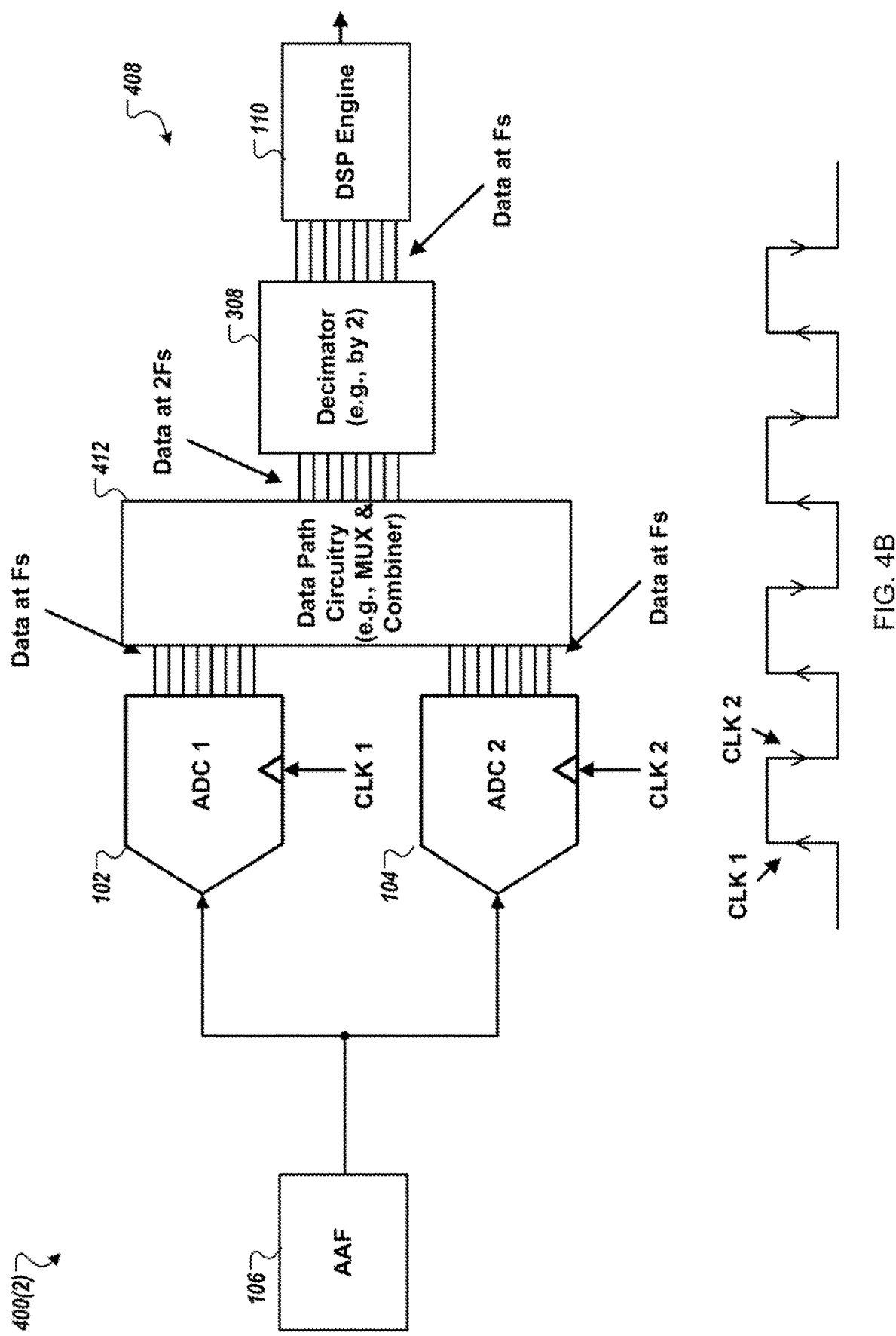

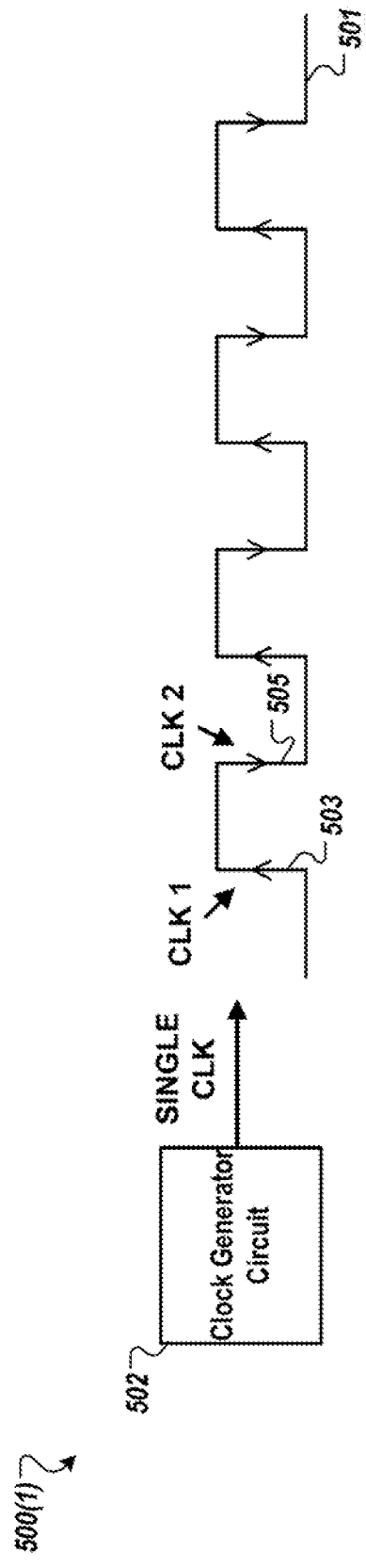
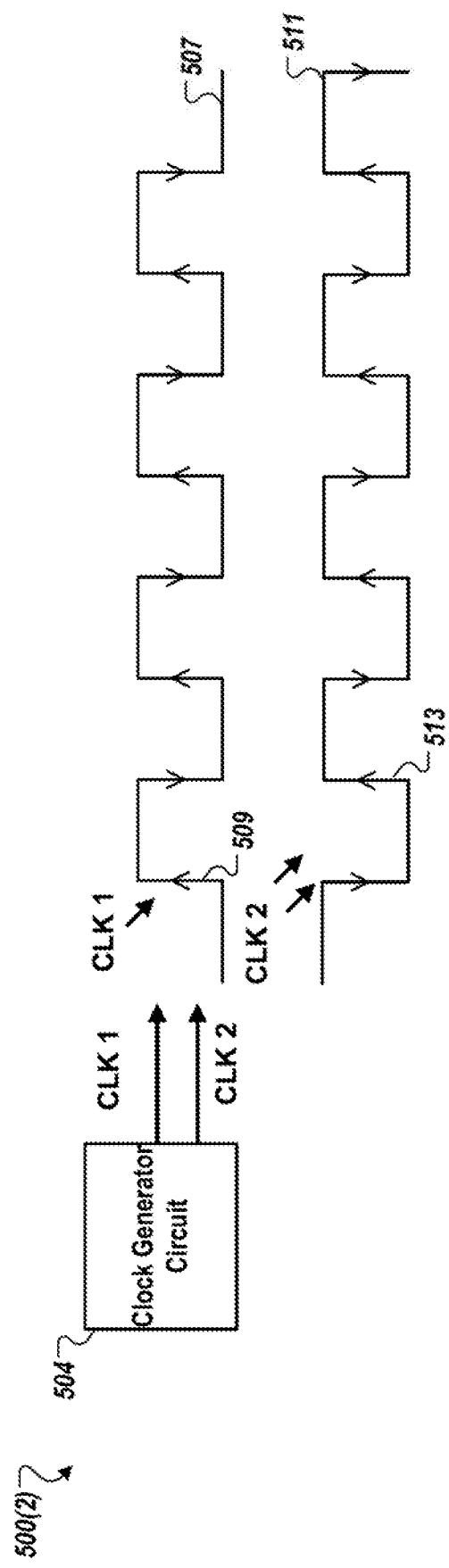
FIG. 5A
FIG. 5B

US 11,563,454 B1

SELECTIVE TIME-INTERLEAVED ANALOG-TO-DIGITAL CONVERTER FOR OUT-OF-BAND BLOCKER MITIGATION

BACKGROUND

A large and growing population of users is enjoying entertainment through the consumption of digital media items, such as music, movies, images, electronic books, and so on. The users employ various electronic devices to consume such media items. Among these electronic devices (referred to herein as endpoint devices, user devices, clients, client devices, or user equipment) are electronic book readers, cellular telephones, Personal Digital Assistants (PDAs), portable media players, tablet computers, netbooks, laptops, and the like. These electronic devices wirelessly communicate with a communications infrastructure to enable the consumption of the digital media items. In order to communicate with other devices wirelessly, these electronic devices include one or more antennas.

BRIEF DESCRIPTION OF DRAWINGS

The present inventions will be understood more fully from the detailed description given below and from the accompanying drawings of various embodiments of the present invention, which, however, should not be taken to limit the present invention to the specific embodiments, but are for explanation and understanding only.

FIG. 4A is a schematic diagram of a receiver circuit of a communication system with the data path circuitry operating in a first mode in the absence of an OOB blocker signal according to one embodiment.

FIG. 4B is a schematic diagram of a receiver circuit of a communication system with the data path circuitry operating in a second mode to mitigate reduction in the SNR of a received signal due to OOB blocker aliasing according to one embodiment.

FIG. 5A is a diagram illustrating a clock generator circuit that generates a single clock signal according to one embodiment.

FIG. 5B is a diagram illustrating a clock generator circuit that generates a first clock signal and a second clock signal according to one embodiment.

DETAILED DESCRIPTION

Figure 1:
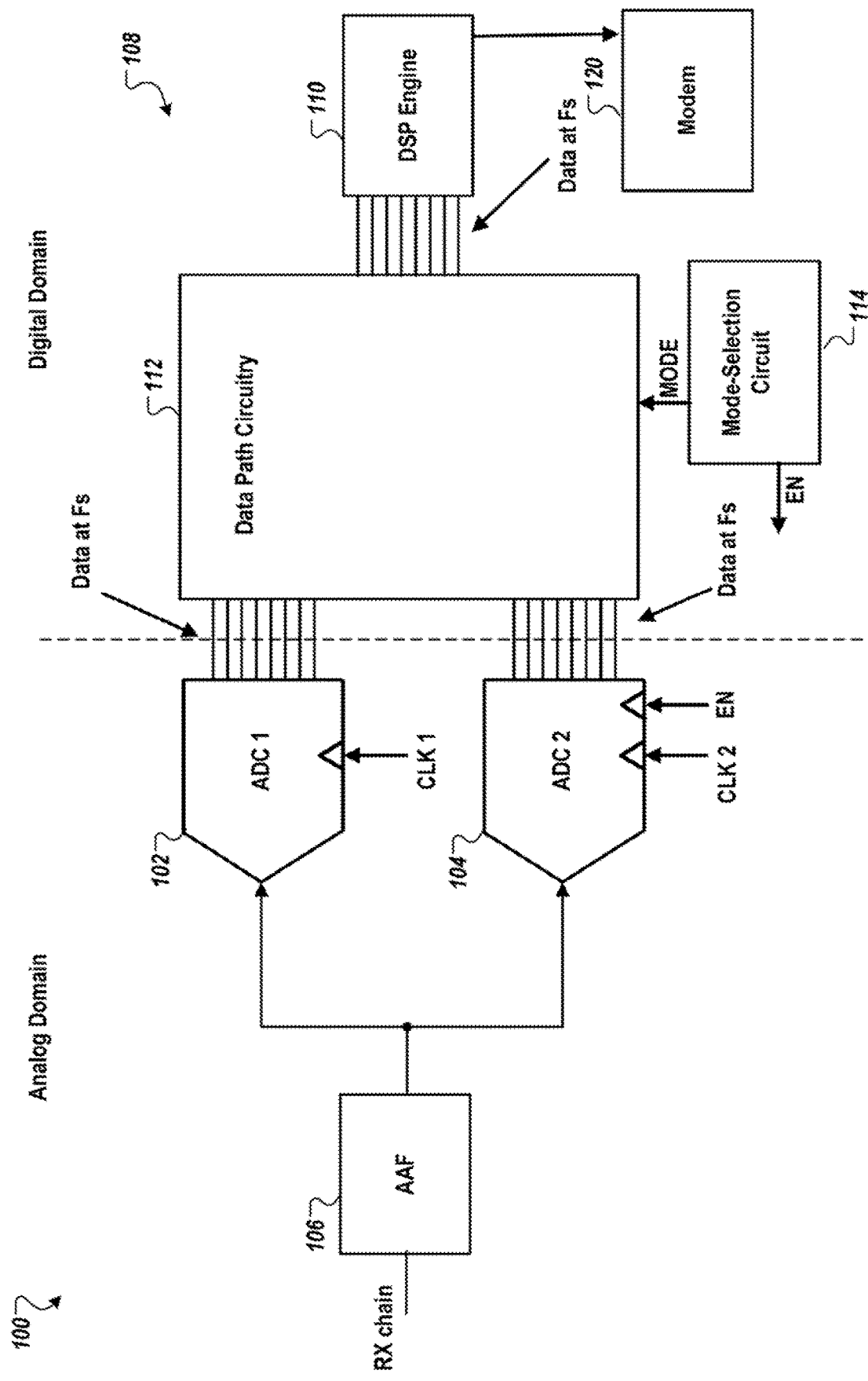
FIG. 1 is a schematic diagram of a receiver circuit of a communication system to mitigate reduction in signal-to-noise ratio (SNR) of a received signal due to out-of-band (OOB) blocker aliasing according to one embodiment.

Technologies directed to mitigating reduction in SNR due to OOB blocker aliasing are described. A receiver system, such as a radio frequency (RF) receiver, can receive signals that include blocker signals in frequency bands that are adjacent (in frequency) to the frequency band of interest. Suppressing large blocker signals can be a challenging task when designing a receiver system. Described herein are techniques for selective time-interleaved analog-to-digital signal conversion to mitigate SNR reduction due to OOB signals. The time-interleaved analog-to-digital signal conversion can be "on-demand" in the presence of an OOB blocker signal. The techniques described herein are directed to reducing or removing undesired signal components in higher-order Nyquist zones (e.g., $2^{nd}$ to $N^{th}$) caused by an OOB blocker signal. A receiver system, as described herein, can include a dual-configuration ADC that can support two modes of operation, which allows for power-efficient operation both in the absence of OOB blocker signals and in the presence of OOB blocker signals.

A receiver system can receive a signal that includes relatively high-power broadband blocker signals in frequency bands that are part of the frequency band of interest and frequency regions that are adjacent to the frequency band of interest. These adjacent frequency regions can be subdivided into Nyquist zones by referencing to the sampling frequency of analog-to-digital conversion. A conventional receiver system can be implemented with an anti-aliasing filter and can sample the signal at an optimal sampling rate in order to reject undesired signals in the $2^{nd}$ to $N^{th}$ Nyquist zones. Insufficient rejection of the undesired signals can lead to aliasing of the signal in the desired signal bandwidth. The aliased frequencies ($F_{alias}$) of the input signal ($F_{in}$) that is sampled at a sampling frequency ($F_s$) is expressed in equation (1) below:

$$F_{alias}=|NF_s-F_{in}| \qquad (1)$$

where N is the order of the Nyquist zone.

Blocker signals, which are signals with such aliased components, can severely degrade the SNR of the received signal and limit the total system throughput of the receiver system. In general, the signals with frequency components in the $2^{nd}$ Nyquist zone are the most challenging to reject due to their close frequency proximity to the desired signal. Conventional receiver systems can use high-order analog AAFs to filter the blocker signals from the input signal before it is received by the ADC. However, using high-order AAFs for blocker filtering before the ADC can result in high power dissipation along with stringent and challenging AAF design constraints and increased costs.

Other conventional solutions to reject blocker signals include using high-speed ADCs. High-speed ADCs can enable gigahertz sampling rates for oversampling. The order of an AAF is inversely proportional to the oversampling ratio. Thus, by exploiting oversampling techniques, the AAF design constraints can be relaxed. In order to achieve high sampling rates, such as in broadband systems, a number M identical ADCs can be interleaved in parallel in the time domain (e.g., time-interleaved). The digital outputs of the M time-interleaved ADCs, which are each sampled at a rate of $F_s$ can be multiplexed to reconstruct the signal at an effective rate of $MF_s$. To the first order, the power dissipation of time-interleaved ADCs increases linearly with the number M of ADCs that are time-interleaved. In addition, generating multi-phase clocking for each ADC core presents an additional challenge for implementing multiple ADCs.

Due to high power requirements, it can be non-economical to employ high sampling rates using time-interleaved ADCs in the absence of OOB blockers, such as AAFs. Aspects of the present disclosure overcome the deficiencies of conventional receiver systems by providing techniques for scaling the sampling rate of time-interleaved ADCs on demand to address situations with large blocker signals as described herein. Aspects of the present disclosure allow for efficient blocker signal rejection without incurring significant implementation and energy costs. The receiver system as described herein can operate and switch between different modes of operation dynamically or according to a known schedule. When modes and conditions of operation are known in advance, time-interleaved ADCs can be used to scale the effective sampling rates by enabling and/or disabling multiple ADCs (or ADC cores) based on the required mode of operation.

The receiver system as described herein provides a technique to efficiently alleviate the SNR performance impact of a wideband OOB blocker that aliases from the $2^{nd}$ Nyquist zone to the desired signal by dynamically enabling time-interleaving of ADCs. In some embodiments, the time-interleaved ADCs can be designed to support two modes of operation to allow for appropriate scaling of the effective sampling rates. For example, by increasing the sampling rate, the $2^{nd}$ Nyquist zone moves higher in frequency and thus can be more effectively suppressed by an analog AAF. The selective time-interleaved ADC techniques as described herein improve the average energy efficiency of the system without sacrificing SNR in the presence of OOB blockers. The selective time-interleaved ADC techniques described herein enable more efficient RF communication operations since in the first mode, normal mode, the time-interleaved ADC is not used with the OOB block signal is not present.

In some embodiments, a time-interleaved ADC includes two identical ADC cores that can be implemented to effectively double the ADC sampling rate. In a first mode of operation during nominal conditions, one of the two ADC cores is disabled, and the time-interleaved ADC operates at a first sampling rate. In a second mode of operation that can be referred to as a blocker mode, when OOB blockers need to be rejected, both ADC cores are enabled, and the time-interleaved ADC operates at a second sampling rate that is effectively double the first sampling rate. Clock signals can be provided to the ADC cores. For example, the first ADC core can operate at a rising edge of the clock signal while the second ADC core can operate at a falling edge of the clock signal. This enables the clock distribution network to be reused for all modes without requiring changes to the clock frequency. In some embodiments, a decimator (e.g., a decimate-by-2 filter) can be used to match the second sampling rate in the second mode to the first sampling rate in the first mode, allowing for the use of a single, common digital signal processing (DSP) circuit in both modes.

FIG. 1 is a schematic diagram of a receiver circuit 100 of a communication system to mitigate reduction in signal-to-noise ratio (SNR) of a received signal due to out-of-band (OOB) blocker aliasing according to one embodiment.

The receiver circuit 100 includes a first analog-to-digital converter (ADC) 102 and a second ADC 104. The first ADC 102 and the second ADC 104 together can be considered to be a time-interleaved ADC. The first ADC 102 and the second ADC 104 are coupled to an output terminal of an analog anti-aliasing filter (AAF) 106. Outputs of the first ADC 102 and the second ADC 104 are coupled to a digital processing circuit 108. The digital processing circuit 108 includes a digital signal processing (DSP) circuit 110 and data path circuitry 112.

The analog AAF 106 receives incoming signals, such as incoming RF signals. For example, the analog AAF 106 is coupled to a receiver chain and can receive an incoming signal that is received via an antenna element that is coupled to the receiver chain that transmits the incoming signal to the analog AAF 106. The antenna element can be coupled to the receiver chain via an RF port. The incoming signal is received as an analog signal. The receiver chain includes an amplifier, such as a low-noise amplifier (LNA), a variable-gain amplifier (VGA), or other suitable amplifier. The receiver chain can also further include RF filters, additional RF amplifiers, local oscillators (LOs), mixers, and the like.

The digital processing circuit 108 can operate in either a first mode or a second mode. The first mode can be considered to be a nominal mode and the second mode can be considered to be an OOB blocker mode. In the first mode, only the first ADC 102 is enabled, and the second ADC 104 is disabled. The first ADC 102 receives the incoming signal and generates samples (e.g., digital samples of the first incoming signal) at a first sampling frequency, or sampling rate, $F_s$. In other words, in the first mode, only a single channel of the receiver circuit 100 is enabled. In the second mode, a multi-channel time-interleaved mode of the receiver circuit 100 is enabled. Prior to the first ADC 102 receiving the incoming signal, the analog AAF 106 filters the incoming signal. The samples are sent by the first ADC 102 over the data path circuitry 112 to the DSP engine 110, and the DSP engine 110 processes the samples.

In the second mode, both the first ADC 102 and the second ADC 104 are enabled. The first ADC 102 receives the incoming signal and generates first samples at the first sampling frequency. The second ADC 104 receives the incoming signal and generates second samples at the first sampling frequency. Prior to the first ADC 102 and the second ADC 104 receiving the incoming signal, the analog AAF 106 filters the incoming signal. The first samples from the first ADC 102 and the second samples from the second ADC 104 are output to the data path circuitry 112, and routed to logic circuitry that can combine the first samples and the second samples in order to generate intermediate samples at a second sampling frequency that is greater than the first sampling frequency. In one embodiment, the second sampling frequency is double the first sampling frequency. In other embodiments, the second sampling frequency is some other factor greater than the first sampling frequency, such as 1.5, 3, etc., such as in cases where the second ADC 104 is not identical to the first ADC 102, and generates the second samples at a sampling frequency that is different than the first sampling frequency. In one embodiment, the first ADC 102 and the second ADC 104 are identical so they sample at the same frequency. In other embodiments, the first ADC 102 and the second ADC 104 are not similar and/or can sample at different sampling rates. It is even possible for the sampling rates to be adjusted fractionally, as opposed to an integer multiplier.

The logic circuitry can then generate third samples from the intermediate samples at the first sampling frequency. The third samples are the result of the combination of the first samples and the second samples, and the sampling frequency can be reduced from the second sampling frequency back to the first sampling frequency, for example by down-sampling the intermediate samples. This can be achieved via a decimator, or a decimator filter. The third samples at the first sampling frequency can be sent to the DSP engine 110 to be processed. The DSP engine 110 outputs the processed samples to a modem 120. The DSP engine 110 can subsequently process the third samples before data is extracted by the modem 120. For example, the DSP engine 110 can perform scaling, phase alignment, additional filtering, or the like, before outputting the samples or stream of samples to the modem 120. Alternatively, the DSP engine 110 can output the third samples to the modem 120 without further processing.

In some embodiments, the logic circuitry is only activated in the second mode. To generate the third samples, the logic circuitry includes a combiner and a decimator (not shown in FIG. 1). The combiner combines the first samples and the second samples into the intermediate samples. In the case where the first ADC 102 and the second ADC 104 are identical, the sampling frequency of the intermediate samples is two times greater than the first sampling frequency. The decimator receives the intermediate samples at the second sampling frequency from the combiner and filters and down-samples the intermediate samples into the third samples at the first sampling frequency.

In another embodiment, in the first mode, only the first ADC 102 is enabled, and the second ADC 104 is disabled. The analog AAF filters a first incoming signal. The first ADC 102 receives the first incoming signal and generates first digital samples of the first incoming signal at a first sampling frequency, or sampling rate, $F_s$, and sends the first digital samples to the digital processing circuit 108 that processes the first digital samples. In the second mode, both the first ADC 102 and the second ADC 104 are enabled. The analog AAF 106 filters a second incoming signal. Both the first ADC 102 and the first ADC 104 receive the second incoming signal and collectively generate second digital samples of the second incoming signal at a second sampling frequency, $F_s'$, that is greater than the first sampling frequency, and send the second digital samples to the digital processing circuit 108 that processes the second digital samples. The digital processing circuit 108 includes the DSP engine 110, the data path circuitry 112, and a mode-selection circuit 114.

In the first mode, a first data path is operatively coupled between the first ADC 102 and the DSP engine 110. The first digital samples are sent from the first ADC 102 to the DSP engine 110 via the first data path. In the second mode, a second data path is operatively coupled between the DSP engine 110 and both of the first ADC 102 and the second ADC 104. The second digital samples are sent from the first ADC 102 and the second ADC 104 to the DSP engine 110 via the second data path. The second data path includes logic circuitry that is part of the second data path. In other words, the logic circuitry is located in the second data path, and is enabled in the second mode. The logic circuitry serves to receive the second digital samples, filter the second digital samples, and down-sample the second digital samples from the second sampling frequency to the first sampling frequency in order to be processed by the DSP engine 110.

The mode-selection circuit 114 determines whether the digital processing circuit 108 is to operate in the first mode or the second mode. When the mode-selection circuit 114 determines that the digital processing circuit 108 is to operate in the second mode, it outputs an enable signal to the second ADC 104. The mode-selection circuit 114 can rely on a single clock signal or two clock signals in order to determine whether the digital processing circuit 108 is to operate in the first mode or the second mode. In one embodiment, the receiver circuit 100 includes a status register that stores a first value indicating that the mode-selection circuit 114 has selected (or enabled) the first mode, and a second value indicating that the mode-selection circuit 114 has selected (or enabled) the second mode. The first mode is indicative of a single-channel mode of the receiver circuit 100 and the second mode is indicative of a multi-channel time-interleaved mode of the receiver circuit 100.

The data path circuitry 112 includes at least a portion of the first data path and a portion of the second data path and is coupled to the mode-selection circuit 114. In the first mode, the mode-selection circuit 114 configures the data path circuitry 112 to input the first digital samples from the first ADC 104 into the DSP engine 110. In the second mode, the mode-selection circuit 114 configures the data path circuitry 112 to combine digital samples of the second incoming signal from both the first ADC 102 and the second ADC 104 into the second digital samples, filter the second digital samples, and down-sample the second digital samples from the second sampling frequency to the first sampling frequency. The second digital samples are the input into the DSP engine 110. The digital signals of the second incoming signal from the first ADC 102 and the second ADC 104 can be combined into the second digital samples at the second sampling frequency by a combiner of the digital processing circuit 108. The second digital samples can be down-sampled from the second sampling frequency to the first sampling frequency by a decimator of the digital processing circuit 108.

Figure 2:
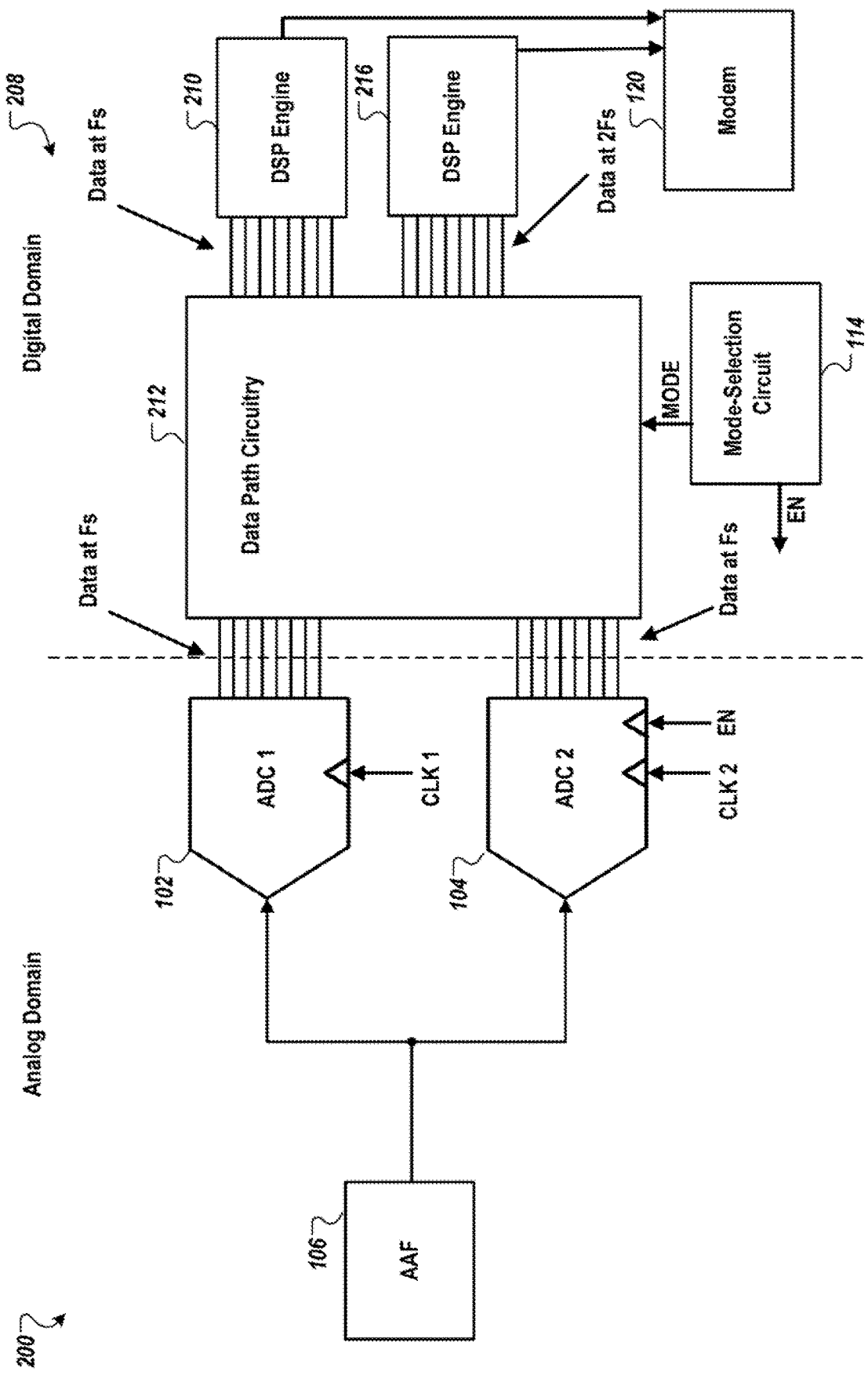
FIG. 2 is a schematic diagram of a receiver circuit of a communication system with a first digital signal processing (DSP) engine and a second DSP engine to mitigate reduction in the SNR of a received signal due to OOB blocker aliasing according to one embodiment.

FIG. 2 is a schematic diagram of a receiver circuit 200 of a communication system with a first DSP engine 210 and a second DSP engine 216 to mitigate reduction in the SNR of a received signal due to 00B blocker aliasing according to one embodiment. The receiver circuit 200 is the same or similar to the receiver circuit 100, except as noted below.

In the depicted embodiment, in the first mode, only the first ADC 102 is enabled, and the second ADC 104 is disabled. The analog AAF filters 106 a first incoming signal. The first ADC 102 receives the first incoming signal and generates first digital samples of the first incoming signal at a first sampling frequency, or sampling rate, $F_s$, and sends the first digital samples to a digital processing circuit 208 that processes the first digital samples. In the second mode, both the first ADC 102 and the second ADC 104 are enabled. The analog AAF 106 filters a second incoming signal. Both the first ADC 102 and the first ADC 104 receive the second incoming signal and collectively generate second digital samples of the second incoming signal at a second sampling frequency, $F_s'$, that is greater than the first sampling frequency, and send the second digital samples to the digital processing circuit 208 that processes the second digital samples. In one embodiment, the second sampling frequency is twice the first sampling frequency. In other embodiments, the second sampling frequency can be greater than the first sampling frequency by some fraction such as 1.5, 3, etc. The digital processing circuit 208 includes a first DSP engine 210, a second DSP engine 216, data path circuitry 212, and a mode-selection circuit 114.

In the first mode, a first data path is operatively coupled between the first ADC 102 and the first DSP engine 210. The first digital samples are sent from the first ADC 102 to the first DSP engine 210 via the first data path. In the second mode, a second data path is operatively coupled to the second DSP engine 216. The second digital samples are sent from the first ADC 102 and the second ADC 104 to the second DSP engine 216 via the second data path. The second data path includes logic circuitry that is part of the second data path. The logic circuitry serves to receive the second digital samples and filter the second digital samples. In one embodiment, the logic circuitry down-samples the second digital samples from the second sampling frequency to the first sampling frequency in order to be processed by the second DSP engine 216. In other embodiments, since the first digital samples are processed by the first DSP engine 210 and the second digital samples are processed by the second DSP engine 216, the sampling frequencies of the first digital samples and the second digital samples need not be the same, and the logic circuitry does not down-sample the second digital samples.

The first DSP engine 210 and/or the second DSP engine 216 output the processed samples to the modem 120. The first DSP engine 210 and/or the second DSP engine 216 can further process samples before data is extracted by the modem 120.

It should be noted that in other embodiments, different configurations of different numbers of DSP engines can be used to process samples at the same sampling frequencies or at different sampling frequencies. For example, in a second mode, first DSP engine 210 and second DSP engine 216 can both sample receive samples at the same sampling frequencies or different sampling frequencies. Alternatively, in a second mode, the first DSP engine 210 can be disabled, while the second DSP engine 216 is enabled to process the samples at a higher sampling frequency.

Figure 3:
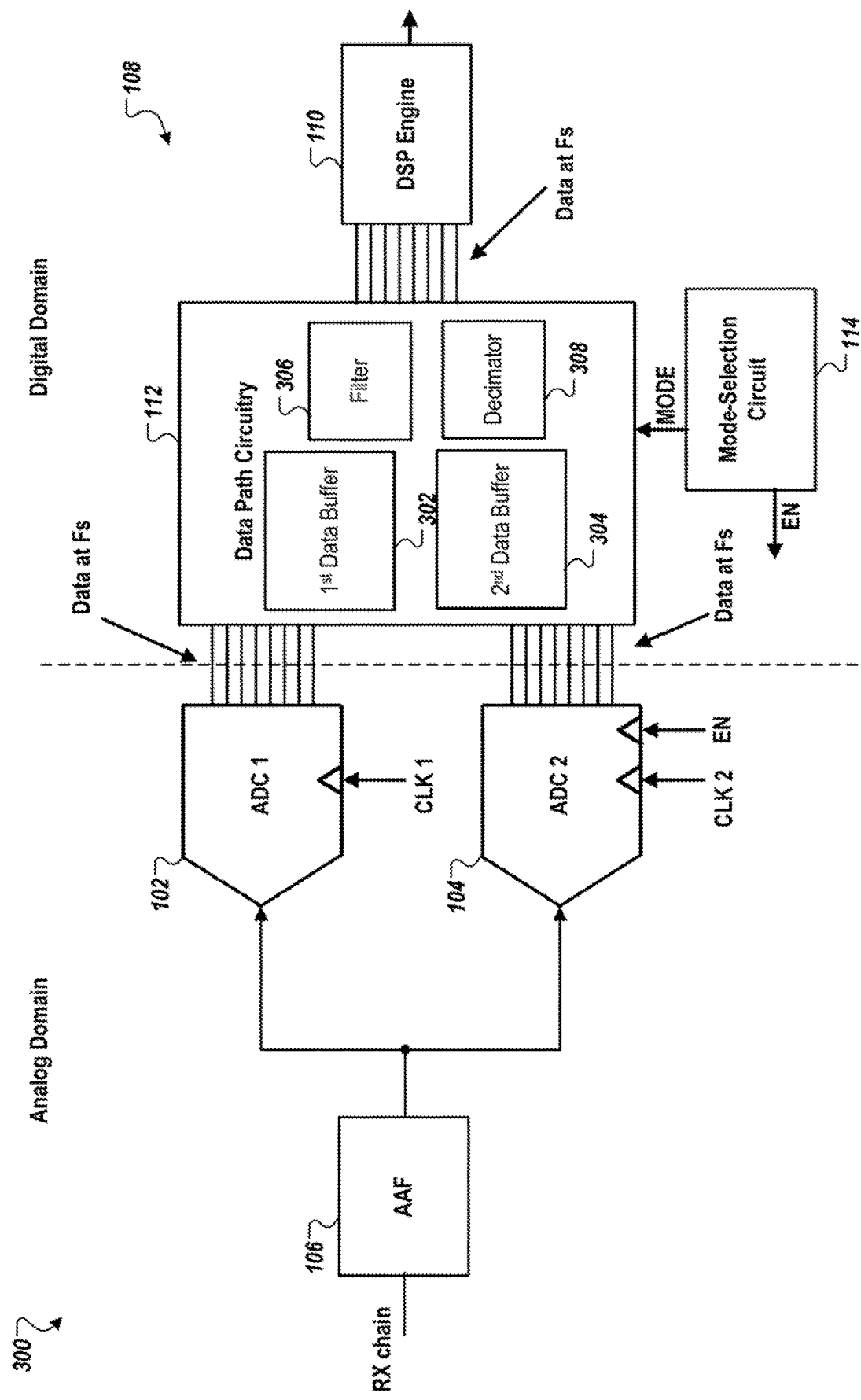
FIG. 3 is a schematic diagram of a receiver circuit of a communication system with the data path circuitry to mitigate reduction in the SNR of a received signal due to OOB blocker aliasing according to one embodiment.

FIG. 3 is a schematic diagram of a receiver circuit 300 of a communication system with the data path circuitry 112 to mitigate reduction in the SNR of a received signal due to OOB blocker aliasing according to one embodiment. The receiver circuit 300 is the same or similar to the receiver circuit 100, as noted by similar reference numbers.

The receiver circuit 300 includes the data path circuitry 112 as described with respect to FIG. 1. The data path circuitry includes a first data buffer 302, a second data buffer 304, a filter 306, and a decimator 308. The filter 306 is coupled to the first data buffer 302 and the second data buffer 304. The decimator 308 is coupled to the filter. In the first mode, the first data buffer 302 stores the first digital samples of the first incoming signal from the first ADC 102. In the second mode, the mode-selection circuit sends the enable signal to the second ADC 104 and informs the data path circuitry to operate in the second mode (e.g., by operatively coupling the first ADC 102 and the second ADC 104 to the DSP engine 110 via the second data path). The first data buffer 302 stores digital samples of the second incoming signal from the first ADC 102 and the second data buffer 304 stores digital samples of the second incoming signal from the second ADC 104. The data path circuitry 112 combines the digital samples from the first ADC 102 and the second ADC 104 and the filter 306 filters the digital samples of the second incoming signal from both the first ADC 102 and the second ADC 104. It should be noted that the combined digital samples are the second digital samples that are considered to be sampled at the second sampling frequency. The decimator 308 down-samples the second digital samples to the first sampling frequency in order to be processed by the DSP engine 110.

FIG. 4A is a schematic diagram of a receiver circuit 400(1) of a communication system with the data path circuitry 112 operating in a first mode in the absence of an OOO blocker signal according to one embodiment. The receiver circuit 400(1) is the same or similar to the receiver circuit 100, as noted by similar reference numbers.

In the first mode, the mode-selection circuit (not shown in FIG. 4A) does not send the enable signal to the second ADC 104, such that only the first ADC 102 is enabled. The mode-selection circuit informs the data path circuitry 412 to operate in the first mode (e.g., by operatively coupling the first ADC 102 to the DSP engine 110 via the first data path).

To determine whether to operate in the first mode or the second mode, the mode-selection circuit of the receiver circuit 400 includes a clock generator circuit (not shown in FIG. 4A) to generate a clock signal. The clock generator circuit is coupled to the first ADC 102 and the second ADC 104 and generates a single clock signal. The clock signal can be a reference signal such as a digital signal or a pulse signal. In one embodiment, the first ADC 102 generates the first digital samples at a first reference point of the clock signal and the second ADC 104 generates the second digital samples at a second reference point of the clock signal. In another embodiment, the first ADC 102 generates the first samples at a first signal transition point of the clock signal and the second ADC 104 generates the second samples at a second signal transition point of the clock signal. For example, in the case of a digital signal the first ADC 102 can generate the first samples at a rising edge (or a positive edge), which is a low-to-high transition of the clock signal and the second ADC 104 can generate the second samples at a falling edge (or a negative edge), which is a high-to-low transition of the clock signal. In other embodiments, the first ADC 102 can generate the first samples at the falling edge and the second ADC 104 can generate the second samples at the rising edge of the clock signal. In the case of a pulse signal, the first ADC 102 can generate the first samples at a leading edge (or front edge) of a pulse of the pulse signal and the second ADC 104 can generate the second samples at a trailing edge (or back edge) of the pulse signal. In other embodiments, the first ADC 102 can generate the first samples at the trailing edge and the second ADC 104 can generate the second samples at the leading edge of the pulse signal.

In the depicted embodiment, the first ADC 102 receives a first clock signal (CLK 1) at a rising edge of the clock signal, and the receiver circuit 400(1) operates in the first mode. In the first mode, only the first ADC 102 is enabled. The first ADC 102 generates the first digital samples at the first sampling frequency and sends them to the DSP engine 110 via a first data path that includes the data path circuitry 412 but not decimator 308.

FIG. 4B is a schematic diagram of a receiver circuit 400(2) of a communication system with the data path circuitry 112 operating in a second mode to mitigate reduction in the SNR of a received signal due to OOB blocker aliasing according to one embodiment. The receiver circuit 400(2) is the same or similar to the receiver circuit 100 and the receiver circuit 400(1), as noted by similar reference numbers.

In the second mode, the mode-selection circuit (not shown in FIG. 4B) sends the enable signal to the second ADC 104, such that both the first ADC 102 and the second ADC 104 are enabled. The mode-selection circuit informs the data path circuitry 412 to operate in the second mode (e.g., by operatively coupling the first ADC 102 and the second ADC 104 to the DSP engine 110 via the second data path).

In the depicted embodiment, the first ADC 102 receives a first clock signal (CLK 1) at a rising edge of the clock signal, and the second ADC 104 receives a second clock signal (CLK2) at a falling edge of the clock signal, and the receiver circuit 400(2) operates in the second mode. In the second mode, both the first ADC 102 and the second ADC 104 are enabled. The first ADC 102 and the second ADC 104 both receive a second incoming signal and collectively generate the second digital samples at the second sampling frequency that is twice the first sampling frequency (of the first digital signals in the first mode). The second data path includes a multiplexer (MUX) and a combiner to combine the digital signals of the second incoming signal at the first sampling frequency from the first ADC 102 and the digital signals of the second incoming signal at the first sampling frequency from the second ADC 104 into the second digital signals at the second sampling frequency. The combiner receives third digital samples from the first ADC 102 and fourth digital samples from the second ADC 104 of the second incoming signals. The third digital samples and the fourth digital samples are sampled at the first sampling frequency. The combiner generates intermediate digital samples at the second sampling frequency that is double the first sampling frequency by combining the third digital samples and the fourth digital samples.

The second data path also includes the decimator 308 to down-sample the intermediate digital samples into the second digital samples with the first sampling frequency (e.g., down-sampling by two) to be processed by the DSP engine 110. The decimator 308 receives the intermediate digital samples from the combiner and generates the second digital samples at the first sampling frequency by filtering and down-sampling the intermediate digital samples in order to be processed by the DSP engine 110.

FIG. 5A is a diagram illustrating a clock generator circuit 502 that generates a single clock signal 501 according to one embodiment. The clock generator circuit 502 can be part of the receiver circuits described herein. For example, the mode-selection circuit 114 of FIG. 1 can use a register value stored in a mode status register, a state signal, or a control signal to determine whether the receiver circuit should operate in the first mode or the second mode. The clock generation circuit 502 generates the single clock signal 501. The first ADC 102 receives the single clock signal 501 and is configured to sample an incoming signal at first signal edges 503 of the single clock signal 501 in both the first mode and the second mode. The second ADC 104 receives the single clock signal 501 and is configured to sample the incoming signal at second signal edges 505 of the single clock signal 501 in the second mode. In one embodiment, the first signal edges refer to a rising edge (or a positive edge), which is a low-to-high transition of the single clock signal and the second signal edges can refer to a falling edge (or a negative edge) of the single clock signal. In other embodiments, the convention can be reversed, in which the first signal edges refer to the falling edges and the second signal edges refer to the rising edges.

FIG. 5B is a diagram illustrating a clock generator circuit 504 that generates a first clock signal 507 and a second clock signal 511 according to one embodiment. The clock generator circuit 502 can be part of the receiver circuits described herein. For example, the mode-selection circuit 114 of FIG. 1 can use a register value stored in a mode status register, a state signal, or a control signal to determine whether the receiver circuit should operate in the first mode or the second mode.

The clock generation circuit 504 generates the first clock signal 507 and the second clock signal 511. The first ADC 102 receives the first clock signal 507 and is configured to sample an incoming signal at first signal edges 509 of the first clock signal 507 in both the first mode and the second mode. The second ADC 104 receives the second clock signal 511 and is configured to sample the incoming signal at first signal edges 513 of the second clock signal 511 in the second mode. The first signal edges 509 and the first signal edges 513 can refer to rising edges, falling edges, or any combination of the first clock signal 507 and the second clock signal 511 respectively.

Figure 6:
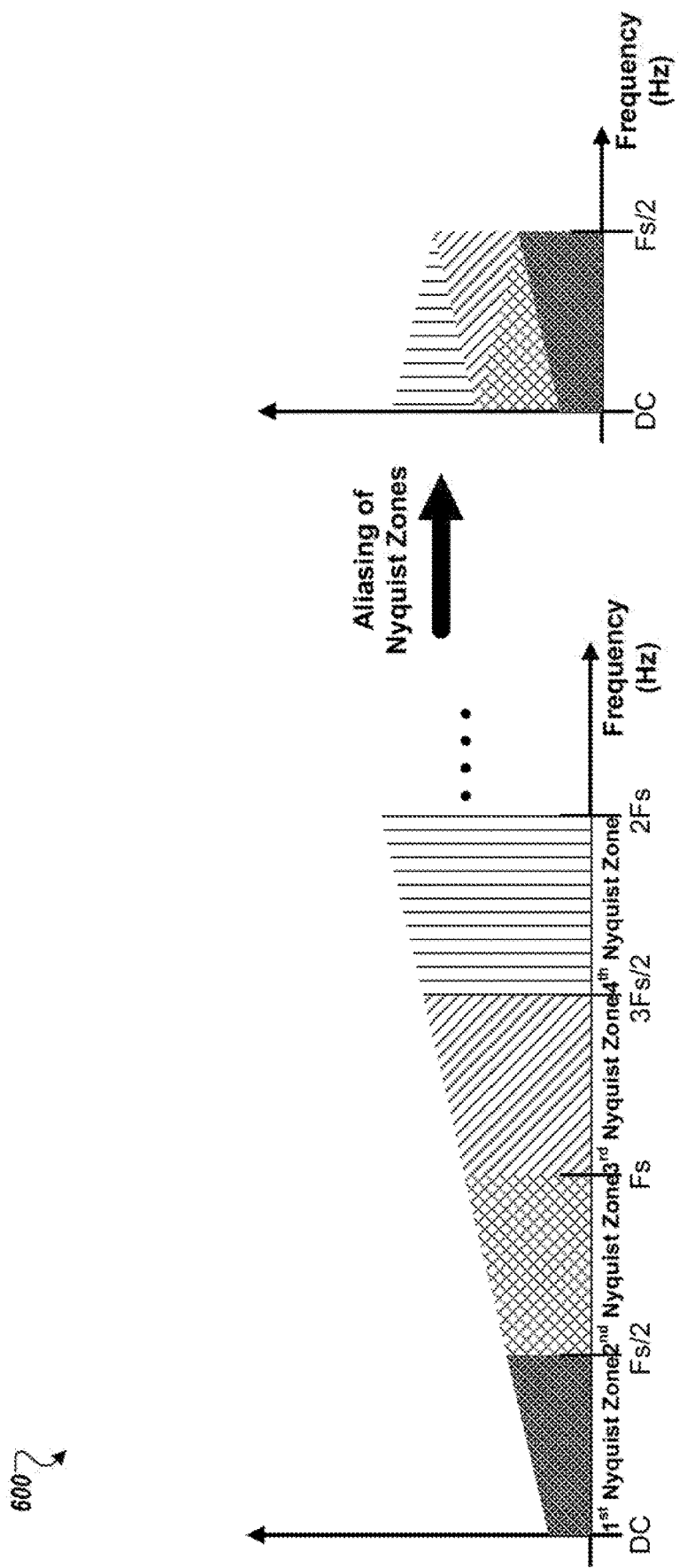
FIG. 6 is a graph that illustrates folding of aliased frequencies onto a first ($1^{st}$) Nyquist zone according to one embodiment.

FIG. 6 is a graph 600 that illustrates folding of aliased frequencies onto a first ($1^{st}$) Nyquist zone according to one embodiment. Signals with aliased frequencies from higher order Nyquist zones (e.g., $2^{nd}$ to $4^{th}$ Nyquist zones as depicted) that are insufficiently rejected can distort the desired signal within the $1^{st}$ Nyquist zone, which is defined up to half of the sampling frequency.

Figure 7:
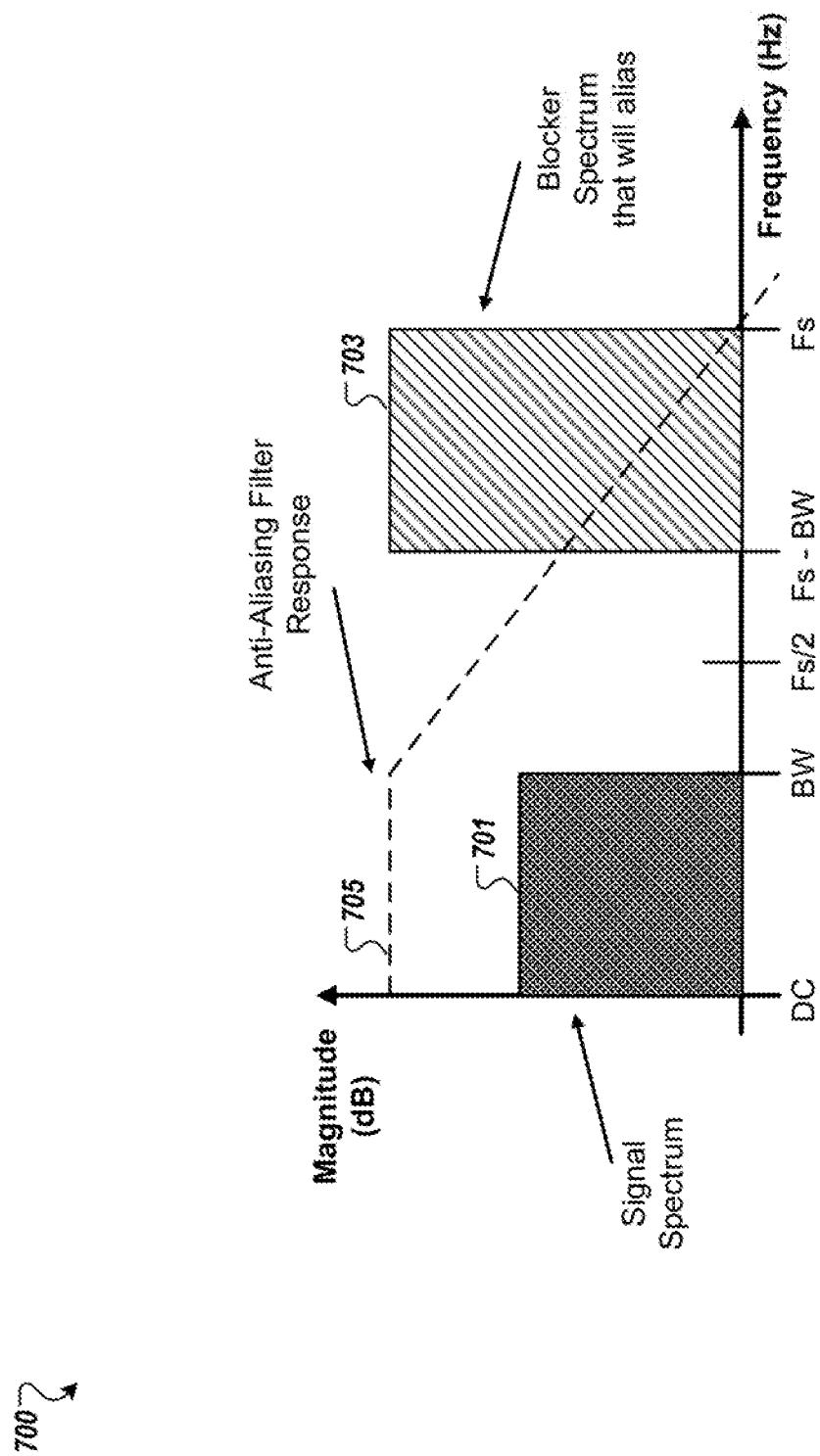
FIG. 7 is a graph that illustrates an analog-to-digital converter (ADC) input spectrum, an OOB blocker in a $2^{nd}$ Nyquist zone, and an analog anti-aliasing filter (AAF) response for a single ADC according to one embodiment.

FIG. 7 is a graph 700 that illustrates an ADC input spectrum 701, an OOB blocker 703 in a $2^{nd}$ Nyquist zone, and an analog AAF response 705 for a single ADC according to one embodiment. The OOB blocker 703 in the $2^{nd}$ Nyquist zone can be partially filtered by an analog AAF filter with the response 705 as shown. In other words, the analog AAF filter can filter the portion of the OOB blocker 703 that lies above the response 705 of the analog AAF filter. The remaining portion of the OOB blocker can alias the desired ADC input spectrum 701.

Figure 8:
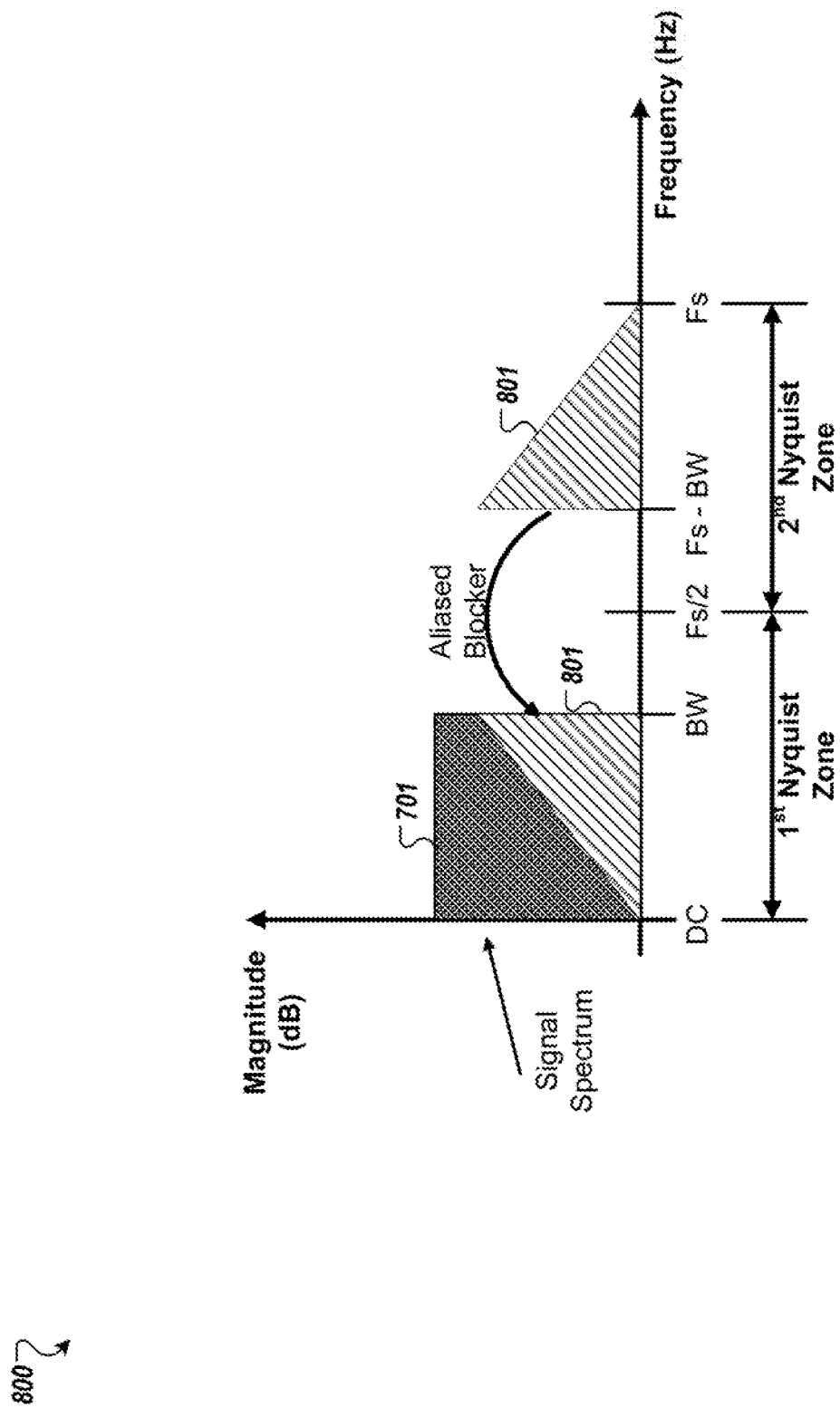
FIG. 8 is a graph that illustrates the remaining portion of the OOB blocker that is aliased on the desired ADC input spectrum of FIG. 7 according to one embodiment.

FIG. 8 is a graph 800 that illustrates the remaining portion 801 of the OOB blocker 703 that is aliased on the desired ADC input spectrum 701 of FIG. 7 according to one embodiment. It should be noted that this figure indicates the filtering of the ADC input spectrum 701 when two selective time-interleaved ADCs are not implemented. The initial portion of the spectrum within the first Nyquist zone, at sampling frequencies less than $F_s/2$ are degraded by the aliased OOB blocker signal from the 2nd Nyquist zone.

Figure 9:
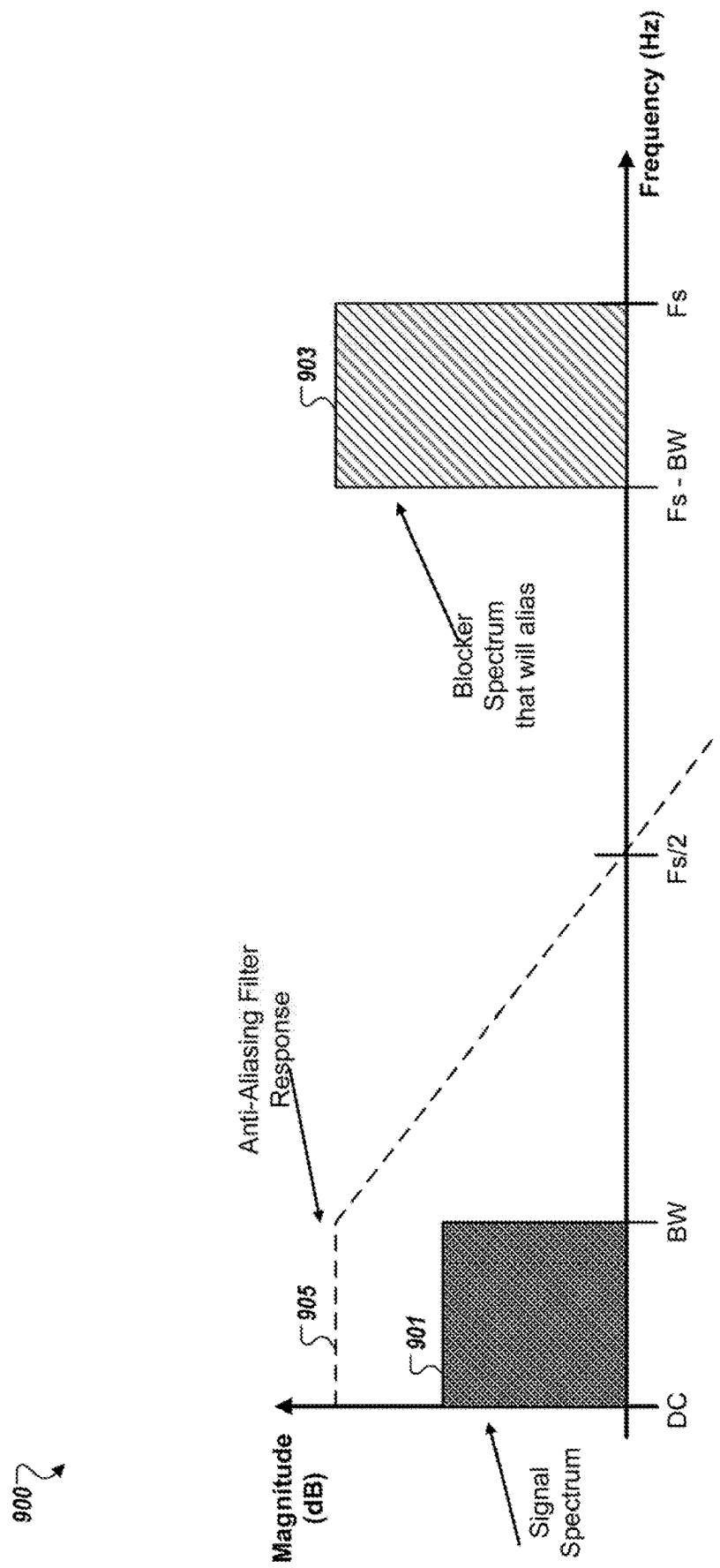
FIG. 9 is a graph that illustrates an ADC input spectrum, and OOB blocker in the $2^{nd}$ Nyquist zone, and an analog AAF response for a selective time-interleaved ADC according to one embodiment.

FIG. 9 is a graph 900 that illustrates an ADC input spectrum 901, and OOB blocker 903 in the $2^{nd}$ Nyquist zone, and an analog AAF response 905 for a time-interleaved ADC according to one embodiment. The time-interleaved ADC, as described herein with two identical time-interleaved ADCs, allows for effectively doubling the sampling rate and thus effectively narrows the response of the AAF filter. This leads to more efficient rejection of the OOB blocker 903 in the $2^{nd}$ Nyquist zone and minimizes aliasing of the desired ADC input spectrum 901.

Figure 10:
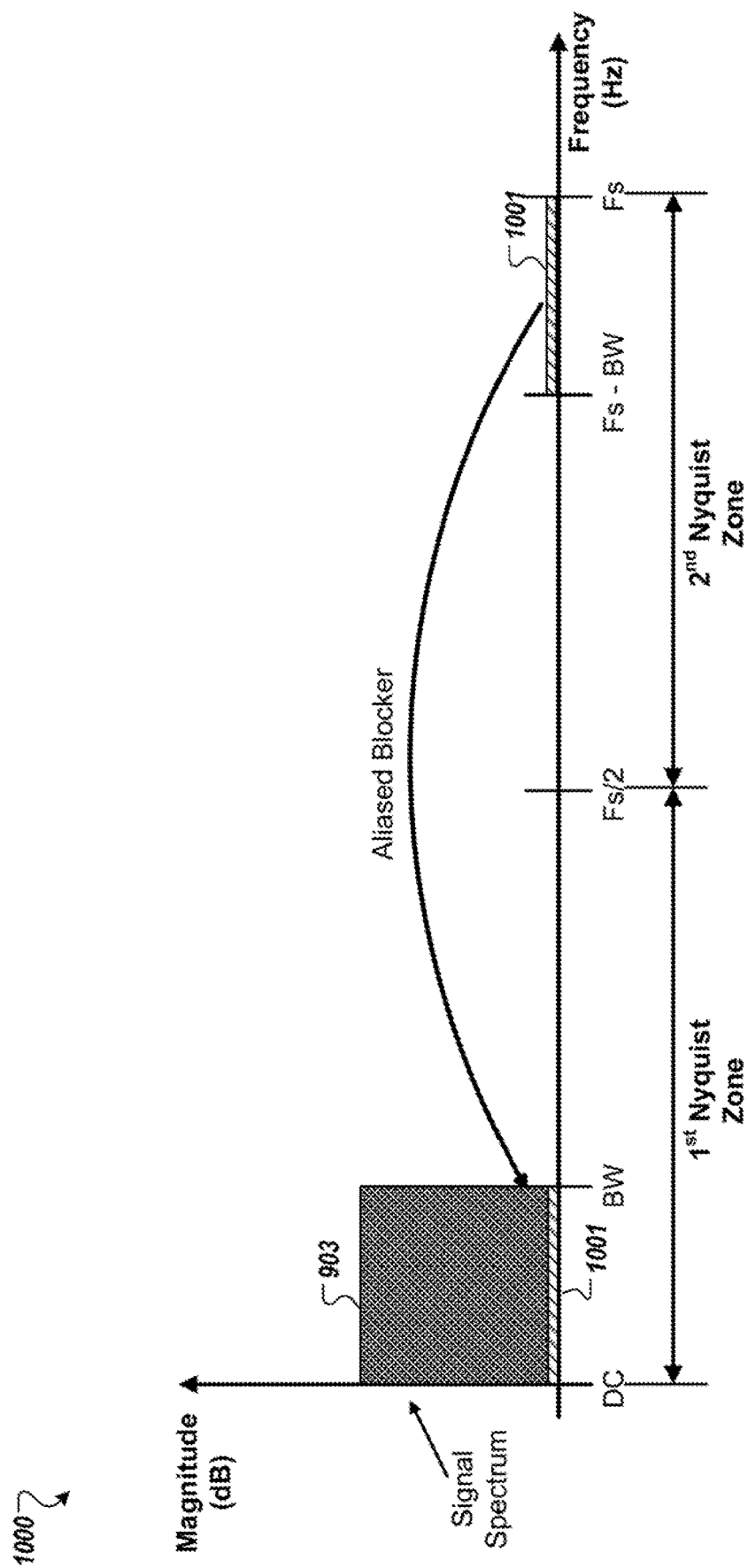
FIG. 10 is a graph that illustrates the remaining portion of the OOB blocker that is aliased on the desired ADC input spectrum of FIG. 9 according to one embodiment.

FIG. 10 is a graph 1000 that illustrates the remaining portion 1001 of the OOB blocker 903 that is aliased on the desired ADC input spectrum 901 of FIG. 9 according to one embodiment. Undesired aliasing of the ADC input spectrum 901 is minimized when a time-interleaved ADC system is implemented. As can be seen, when a selective time-interleaved ADC system is implemented, a minimal edge of the signal that is within the $2^{nd}$ Nyquist zone is not filtered out (e.g., by the analog AAF filter), however, the portion of the signal that is degraded is substantially less than $F_s/2$ in contrast to the cases depicted in FIG. 8. This is due to the fact that by implementing two ADCs in the selective time-interleaved ADC system, the effective sampling frequency is doubled, thereby pushing the $2^{nd}$ Nyquist zone further away (in terms of sampling frequency $F_s$) from the desired ADC input spectrum and allowing the analog AAF filter to filter out a greater portion of the OOB blocker signal present in the $2^{nd}$ Nyquist zone.

Figure 11:
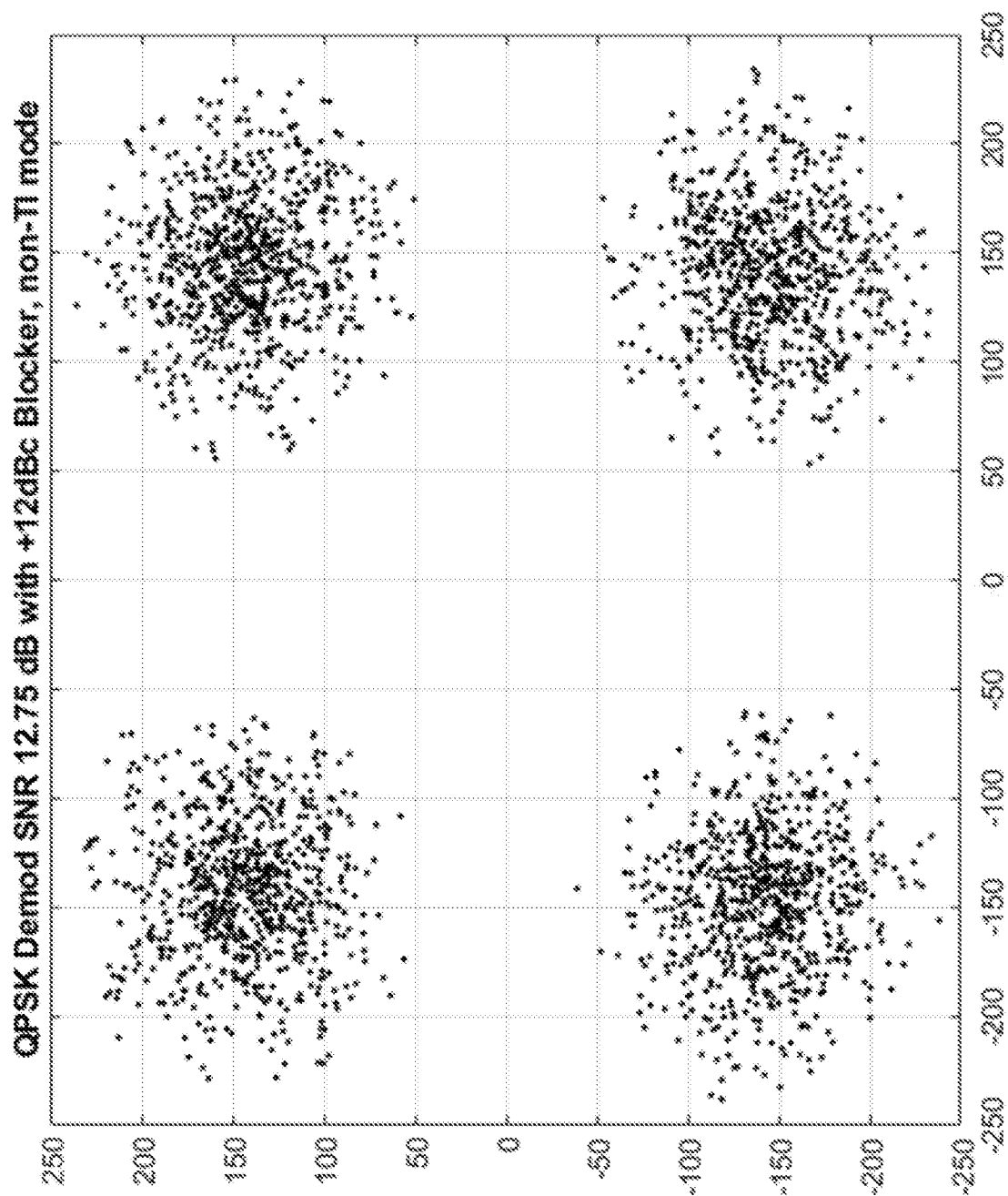
FIG. 11 is a diagram that shows a phase-shift keying (QPSK) constellation distribution that illustrates the demodulated SNR performance of a receiver circuit with a single ADC in the presence of OOB blocker according to one embodiment.

FIG. 11 is a quadrature phase-shift keying (QPSK) constellation diagram 1100 that illustrates the demodulated SNR performance of a receiver circuit with a single ADC in the presence of OOB blocker in the $2^{nd}$ Nyquist zone according to one embodiment. The QPSK constellation diagram 1100 shows demodulated signal as a scatter diagram of data symbols in the complex plane at symbol sampling instants. The QPSK constellation diagram 1100 shows the demodulated constellation points when the blocker power in the $2^{nd}$ Nyquist zone is 12 dB higher than the signal power and occupies the same bandwidth as the input signal. The demodulated constellation is noisy with a higher spread in the demodulated constellation points due to interference from the aliased blocker present in the $2^{nd}$ Nyquist zone.

Figure 12:
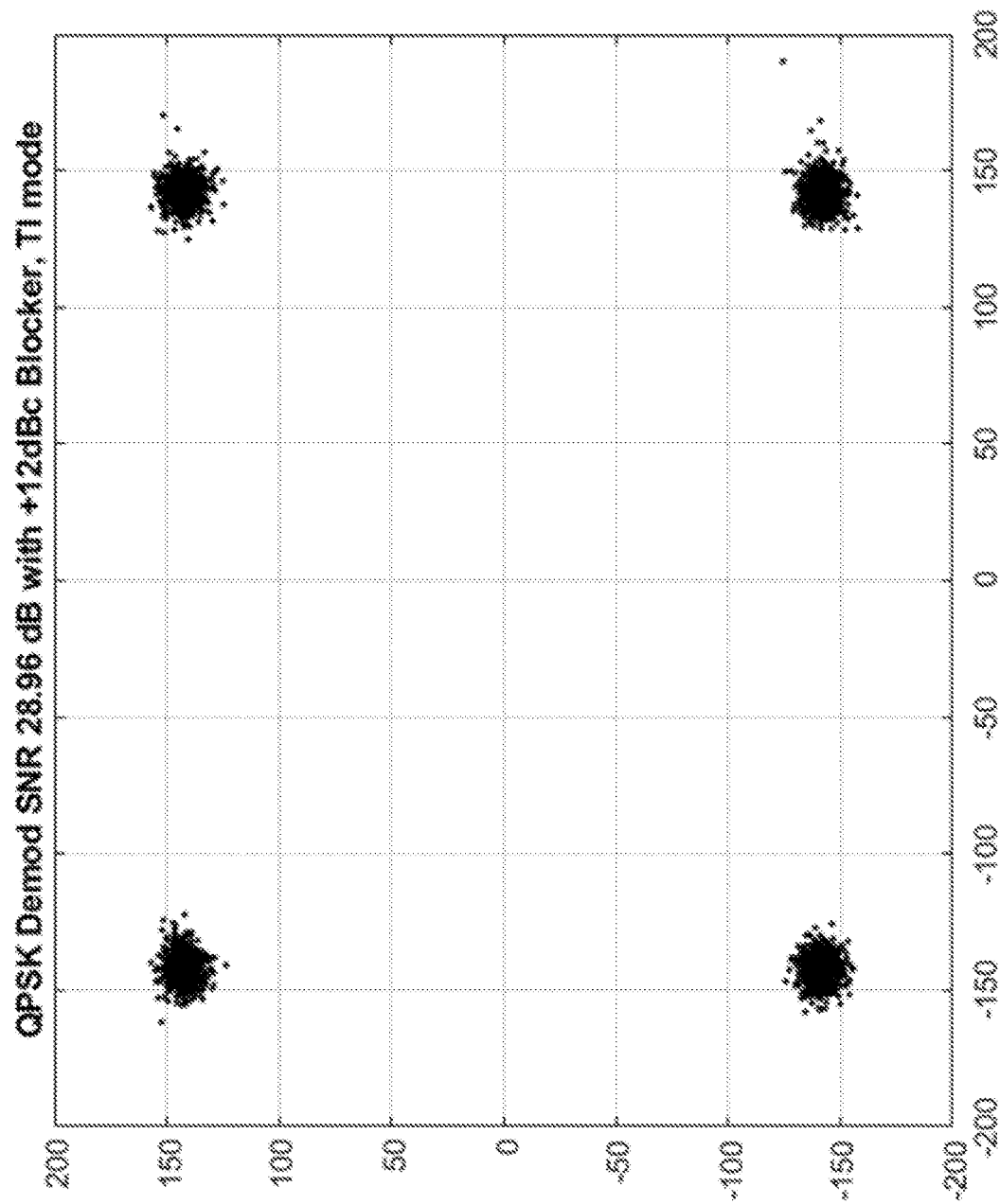
FIG. 12 is a diagram that shows a phase-shift keying (QPSK) constellation distribution that illustrates the demodulated SNR performance of a receiver circuit with selective time-interleaved ADCs in the presence of OOB blocker according to one embodiment.

FIG. 12 is a QPSK constellation diagram 1200 that illustrates the demodulated SNR performance of a receiver circuit with selective time-interleaved ADCs in the presence of OOB blocker in the $2^{nd}$ Nyquist zone according to one embodiment. The receiver circuit with time-interleaved ADCs can be similar to the receiver circuits described herein. QPSK constellation diagram 1200 shows the demodulated constellation points when the blocker power in the $2^{nd}$ Nyquist zone is 12 dB higher than the signal power and occupies the same bandwidth as the input signal. When selective time-interleaved ADC mode is enabled, the demodulated constellation is less noisy and SNR is improved due to increased rejection of the blocker present in the $2^{nd}$ Nyquist zone.

Figure 13:
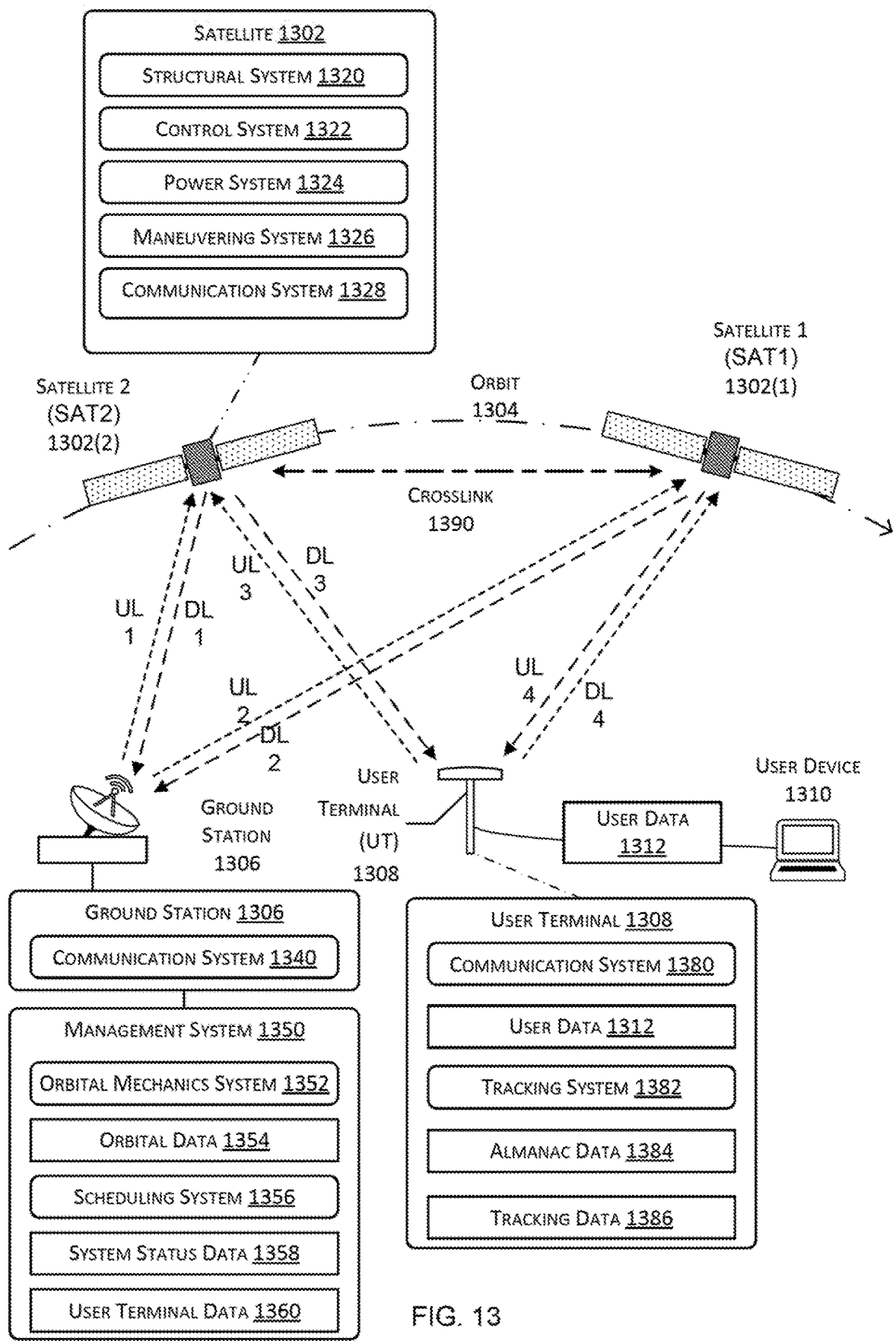
FIG. 13 illustrates a system including a constellation of satellites, each satellite being in orbit according to one embodiment.

FIG. 13 illustrates a system 1300 including a constellation of satellites 1302(1), 1302(2), . . . , 1302(S), each satellite 1302 being in orbit 1304 according to one embodiment. The system 1300 shown here comprises a plurality (or "constellation") of satellites 1302(1), 1302(2), . . . , 1302(S), each satellite 1302 being in orbit 1304. Also shown is a ground station 1306, user terminal (UTs) 1308, and a user device 1310.

The constellation may comprise hundreds or thousands of satellites 1302, in various orbits 1304. For example, one or more of these satellites 1302 may be in non-geosynchronous orbits (NGOs) in which they are in constant motion with respect to the Earth. For example, the orbit 1304 is a low earth orbit (LEO). In this illustration, orbit 1304 is depicted with an arc pointed to the right. A first satellite (SAT1) 1302(1) is leading (ahead of) a second satellite (SAT2) 1302(2) in the orbit 1304. The satellite 1302 is discussed in more detail with regard to FIG. 14.

One or more ground stations 1306 are in communication with one or more satellites 1302. The ground stations 1306 may pass data between the satellites 1302, a management system 1350, networks such as the Internet, and so forth. The ground stations 1306 may be emplaced on land, on vehicles, at sea, and so forth. Each ground station 1306 may comprise a communication system 1340. Each ground station 1306 may use the communication system 1340 to establish communication with one or more satellites 1302, other ground stations 1306, and so forth. The ground station 1306 may also be connected to one or more communication networks. For example, the ground station 1306 may connect to a terrestrial fiber optic communication network. The ground station 1306 may act as a network gateway, passing user data 1312 or other data between the one or more communication networks and the satellites 1302. Such data may be processed by the ground station 1306 and communicated via the communication system 1340. The communication system 1340 of a ground station may include components similar to those of the communication system of a satellite 1302 and may perform similar communication functionalities. For example, the communication system 1340 may include one or more modems, digital signal processors, power amplifiers, antennas (including at least one antenna that implements multiple antenna elements, such as a phased array antenna), processors, memories, storage devices, communications peripherals, interface buses, and so forth. The communication system 1340 may include time-interleaved ADCs (such as the first ADC 102 and the second ADC 104 as described herein) to mitigate the effects of aliasing of received signals due to 00B blockers. The communication system of a satellite 1302 can include similar time-interleaved ADCs.

The ground stations 1306 are in communication with a management system 1350. The management system 1350 is also in communication, via the ground stations 1306, with the satellites 1302 and the UTs 1308. The management system 1350 coordinates operation of the satellites 1302, ground stations 1306, UTs 1308, and other resources of the system 1300. The management system 1350 may comprise one or more of an orbital mechanics system 1352 or a scheduling system 1356.

The orbital mechanics system 1352 determines orbital data 1354 that is indicative of a state of a particular satellite 1302 at a specified time. In one implementation, the orbital mechanics system 1352 may use orbital elements that represent characteristics of the orbit 1304 of the satellites 1302 in the constellation to determine the orbital data 1354 that predicts location, velocity, and so forth of particular satellites 1302 at particular times or time intervals. For example, the orbital mechanics system 1352 may use data obtained from actual observations from tracking stations, data from the satellites 1302, scheduled maneuvers, and so forth to determine the orbital elements. The orbital mechanics system 1352 may also consider other data, such as space weather, collision mitigation, orbital elements of known debris, and so forth.

The scheduling system 1356 schedules resources to provide communication to the UTs 1308. For example, the scheduling system 1356 may determine handover data that indicates when communication is to be transferred from the first satellite 1302(1) to the second satellite 1302(2). Continuing the example, the scheduling system 1356 may also specify communication parameters such as frequency, timeslot, and so forth. During operation, the scheduling system 1356 may use information such as the orbital data 1354, system status data 1358, user terminal data 1360, and so forth.

The system status data 1358 may comprise information such as which UTs 1308 are currently transferring data, satellite availability, current satellites 1302 in use by respective UTs 1308, capacity available at particular ground stations 1306, and so forth. For example, the satellite availability may comprise information indicative of satellites 1302 that are available to provide communication service or those satellites 1302 that are unavailable for communication service. Continuing the example, a satellite 1302 may be unavailable due to malfunction, previous tasking, maneuvering, and so forth. The system status data 1358 may be indicative of past status, predictions of future status, and so forth. For example, the system status data 1358 may include information such as projected data traffic for a specified interval of time based on previous transfers of user data 1312. In another example, the system status data 1358 may be indicative of future status, such as a satellite 1302 being unavailable to provide communication service due to scheduled maneuvering, scheduled maintenance, scheduled decommissioning, and so forth.

The user terminal data 1360 may comprise information such a location of a particular UT 1308. The user terminal data 1360 may also include other information such as a priority assigned to user data 1312 associated with that UT 1308, information about the communication capabilities of that particular UT 1308, and so forth. For example, a particular UT 1308 in use by a business may be assigned a higher priority relative to a UT 1308 operated in a residential setting. Over time, different versions of UTs 1308 may be deployed, having different communication capabilities such as being able to operate at particular frequencies, supporting different signal encoding schemes, having different antenna configurations, and so forth.

The UT 1308 includes a communication system 1380 to establish communication with one or more satellites 1302. The communication system 1380 of the UT 1308 may include components similar to those of the communication system 1412 of a satellite 1302 and may perform similar communication functionalities. For example, the communication system 1380 may include one or more modems, digital signal processors, power amplifiers, antennas (including at least one antenna that implements multiple antenna elements, such as a phased array antenna), processors, memories, storage devices, communications peripherals, interface buses, and so forth. The UT 1308 passes user data 1312 between the constellation of satellites 1302 and the user device 1310. The user data 1312 includes data originated by the user device 1310 or addressed to the user device 1310. The UT 1308 may be fixed or in motion. For example, the UT 1308 may be used at a residence, or on a vehicle such as a car, boat, aerostat, drone, airplane, and so forth.

The UT 1308 includes a tracking system 1382. The tracking system 1382 uses almanac data 1384 to determine tracking data 1386. The almanac data 1384 provides information indicative of orbital elements of the orbit 1304 of one or more satellites 1302. For example, the almanac data 1384 may comprise orbital elements such as "two-line element" data for the satellites 1302 in the constellation that are broadcast or otherwise sent to the UTs 1308 using the communication system 1380.

The tracking system 1382 may use the current location of the UT 1308 and the almanac data 1384 to determine the tracking data 1386 for the satellite 1302. For example, based on the current location of the UT 1308 and the predicted position and movement of the satellites 1302, the tracking system 1382 is able to calculate the tracking data 1386. The tracking data 1386 may include information indicative of azimuth, elevation, distance to the second satellite, time of flight correction, or other information at a specified time. The determination of the tracking data 1386 may be ongoing. For example, the first UT 1308 may determine tracking data 1386 every 1300 ms, every second, every five seconds, or at other intervals.

With regard to FIG. 13, an uplink is a communication link which allows data to be sent to a satellite 1302 from a ground station 1306, UT 1308, or device other than another satellite 1302. Uplinks are designated as UL1, UL2, UL3 and so forth. For example, UL1 is a first uplink from the ground station 1306 to the second satellite 1302(2). In comparison, a downlink is a communication link which allows data to be sent from the satellite 1302 to a ground station 1306, UT 1308, or device other than another satellite 1302. For example, DL1 is a first downlink from the second satellite 1302(2) to the ground station 1306. The satellites 1302 may also be in communication with one another. For example, an intersatellite link 1390 provides for communication between satellites 1302 in the constellation.

The satellite 1302, the ground station 1306, the user terminal 1308, the user device 1310, the management system 1350, or other systems described herein may include one or more computer devices or computer systems comprising one or more hardware processors, computer-readable storage media, and so forth. For example, the hardware processors may include application specific integrated circuits (ASICs), field-programmable gate arrays (FPGAs), digital signal processors (DSPs), and so forth. Embodiments may be provided as a software program or computer program including a non-transitory computer-readable storage medium having stored thereon instructions (in compressed or uncompressed form) that may be used to program a computer (or other electronic device) to perform the processes or methods described herein. The computer-readable storage medium may be one or more of an electronic storage medium, a magnetic storage medium, an optical storage medium, a quantum storage medium, and so forth. For example, the computer-readable storage medium may include, but is not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions. Further embodiments may also be provided as a computer program product including a transitory machine-readable signal (in compressed or uncompressed form). Examples of transitory machine-readable signals, whether modulated using a carrier or unmodulated, include, but are not limited to, signals that a computer system or machine hosting or running a computer program can be configured to access, including signals transferred by one or more networks. For example, the transitory machine-readable signal may comprise transmission of software by the Internet.

Figure 14:
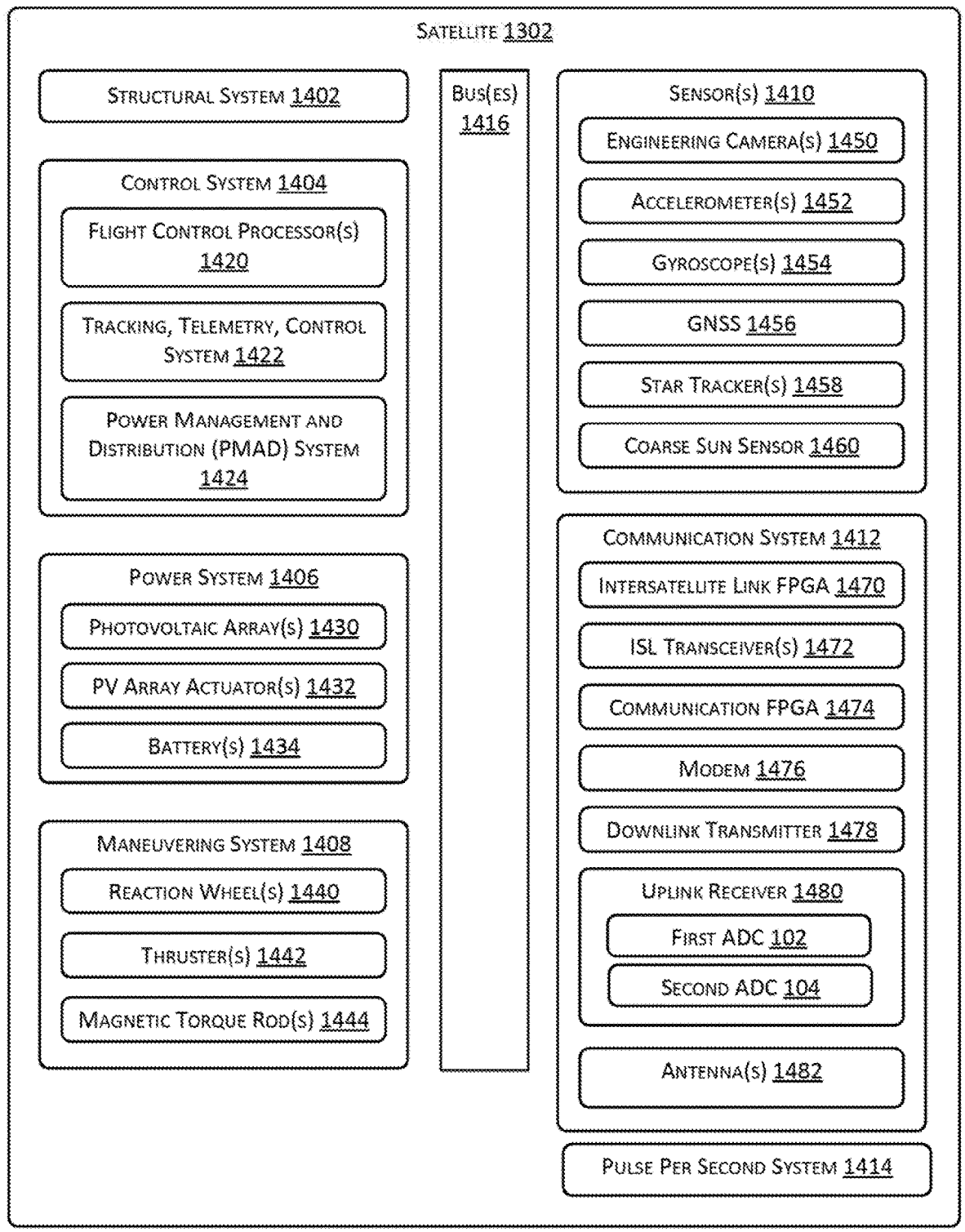
FIG. 14 is a block diagram of some systems associated with the satellite, according to some implementations.

FIG. 14 is a block diagram of some systems associated with the satellite 1302, according to some implementations. The satellite 1302 may comprise a structural system 1402, a control system 1404, a power system 1406, a maneuvering system 1408, one or more sensors 1410, and a communication system 1412. A pulse per second (PPS) system 1414 may be used to provide timing reference to the systems onboard the satellite 1302. One or more busses 1416 may be used to transfer data between the systems onboard the satellite 1302. In some implementations, redundant busses 1416 may be provided. The busses 1416 may include, but are not limited to, data busses such as Controller Area Network Flexible Data Rate (CAN FD), Ethernet, Serial Peripheral Interface (SPI), and so forth. In some implementations the busses 1416 may carry other signals. For example, a radio frequency bus may comprise coaxial cable, waveguides, and so forth to transfer radio signals from one part of the satellite 1302 to another. In other implementations, some systems may be omitted or other systems added.

One or more of these systems may be communicatively coupled with one another in various combinations.

The structural system 1402 comprises one or more structural elements to support operation of the satellite 1302. For example, the structural system 1402 may include trusses, struts, panels, and so forth. The components of other systems may be affixed to, or housed by, the structural system 1402. For example, the structural system 1402 may provide mechanical mounting and support for solar panels in the power system 1406. The structural system 1402 may also provide for thermal control to maintain components of the satellite 1302 within operational temperature ranges. For example, the structural system 1402 may include louvers, heat sinks, radiators, and so forth.

The control system 1404 provides various services, such as operating the onboard systems, resource management, providing telemetry, processing commands, and so forth. For example, the control system 1404 may direct operation of the communication system 1412. The control system 1404 may include one or more flight control processors 1420. The flight control processors 1420 may comprise one or more processors, FPGAs, and so forth. A tracking, telemetry, and control (TTC) system 1422 may include one or more processors, radios, and so forth. For example, the TTC system 1422 may comprise a dedicated radio transmitter and receiver to receive commands from a ground station 1306, send telemetry to the ground station 1306, and so forth. A power management and distribution (PMAD) system 1424 may direct operation of the power system 1406, control distribution of power to the systems of the satellite 1302, control battery 1434 charging, and so forth.

The power system 1406 provides electrical power for operation of the components onboard the satellite 1302. The power system 1406 may include components to generate electrical energy. For example, the power system 1406 may comprise one or more photovoltaic arrays 1430 comprising a plurality of photovoltaic cells, thermoelectric devices, fuel cells, and so forth. One or more PV array actuators 1432 may be used to change the orientation of the photovoltaic array(s) 1430 relative to the satellite 1302. For example, the PV array actuator 1432 may comprise a motor. The power system 1406 may include components to store electrical energy. For example, the power system 1406 may comprise one or more batteries 1434, fuel cells, and so forth.

The maneuvering system 1408 maintains the satellite 1302 in one or more of a specified orientation or orbit 1304. For example, the maneuvering system 1408 may stabilize the satellite 1302 with respect to one or more axes. In another example, the maneuvering system 1408 may move the satellite 1302 to a specified orbit 1304. The maneuvering system 1408 may include one or more of reaction wheel(s) 1440, thrusters 1442, magnetic torque rods 1444, solar sails, drag devices, and so forth. The thrusters 1442 may include, but are not limited to, cold gas thrusters, hypergolic thrusters, solid-fuel thrusters, ion thrusters, arcjet thrusters, electrothermal thrusters, and so forth. During operation, the thrusters may expend propellant. For example, an electrothermal thruster may use water as propellant, using electrical power obtained from the power system 1406 to expel the water and produce thrust. During operation, the maneuvering system 1408 may use data obtained from one or more of the sensors 1410.

The satellite 1302 includes one or more sensors 1410. The sensors 1410 may include one or more engineering cameras 1450. For example, an engineering camera 1450 may be mounted on the satellite 1302 to provide images of at least a portion of the photovoltaic array 1430. Accelerometers 1452 provide information about acceleration of the satellite 1302 along one or more axes. Gyroscopes 1454 provide information about rotation of the satellite 1302 with respect to one or more axes. The sensors 1410 may include a global navigation satellite system (GNSS) 1456 receiver, such as Global Positioning System (GPS) receiver, to provide information about the position of the satellite 1302 relative to Earth. In some implementations the GNSS 1456 may also provide information indicative of velocity, orientation, and so forth. One or more star trackers 1458 may be used to determine an orientation of the satellite 1302. A coarse sun sensor 1460 may be used to detect the sun, provide information on the relative position of the sun with respect to the satellite 1302, and so forth. The satellite 1302 may include other sensors 1410 as well. For example, the satellite 1302 may include a horizon detector, radar, lidar, and so forth.

The communication system 1412 provides communication with one or more other devices, such as other satellites 1302, ground stations 1306, user terminals 1308, and so forth. The communication system 1412 may include one or more modems 1476, digital signal processors, power amplifiers, antennas (including at least one antenna that implements multiple antenna elements, such as a phased array antenna) 1482, processors, memories, storage devices, communications peripherals, interface buses, and so forth. Such components support communications with other satellites 1302, ground stations 1306, user terminals 1308, and so forth using radio frequencies within a desired frequency spectrum. The communications may involve multiplexing, encoding, and compressing data to be transmitted, modulating the data to a desired radio frequency, and amplifying it for transmission. The communications may also involve demodulating received signals and performing any necessary de-multiplexing, decoding, decompressing, error correction, and formatting of the signals. Data decoded by the communication system 1412 may be output to other systems, such as to the control system 1404, for further processing. Output from a system, such as the control system 1404, may be provided to the communication system 1412 for transmission.

The communication system 1412 may include hardware to support the intersatellite link 1390. For example, an intersatellite link FPGA 1470 may be used to modulate data that is sent and received by an ISL transceiver 1472 to send data between satellites 1302. The ISL transceiver 1472 may operate using radio frequencies, optical frequencies, and so forth.

A communication FPGA 1474 may be used to facilitate communication between the satellite 1302 and the ground stations 1306, UTs 1308, and so forth. For example, the communication FPGA 1474 may direct operation of a modem 1476 to modulate signals sent using a downlink transmitter 1478 and demodulate signals received using an uplink receiver 1480. The uplink receiver 1480 may include time-interleaved ADCs (such as the first ADC 102 and the second ADC 104 as described herein) to mitigate the effects of aliasing of received signals due to 00B blockers. The satellite 1302 may include one or more antennas 1482. For example, one or more parabolic antennas may be used to provide communication between the satellite 1302 and one or more ground stations 1306. In another example, a phased array antenna may be used to provide communication between the satellite 1302 and the UTs 1308.

Figure 15:
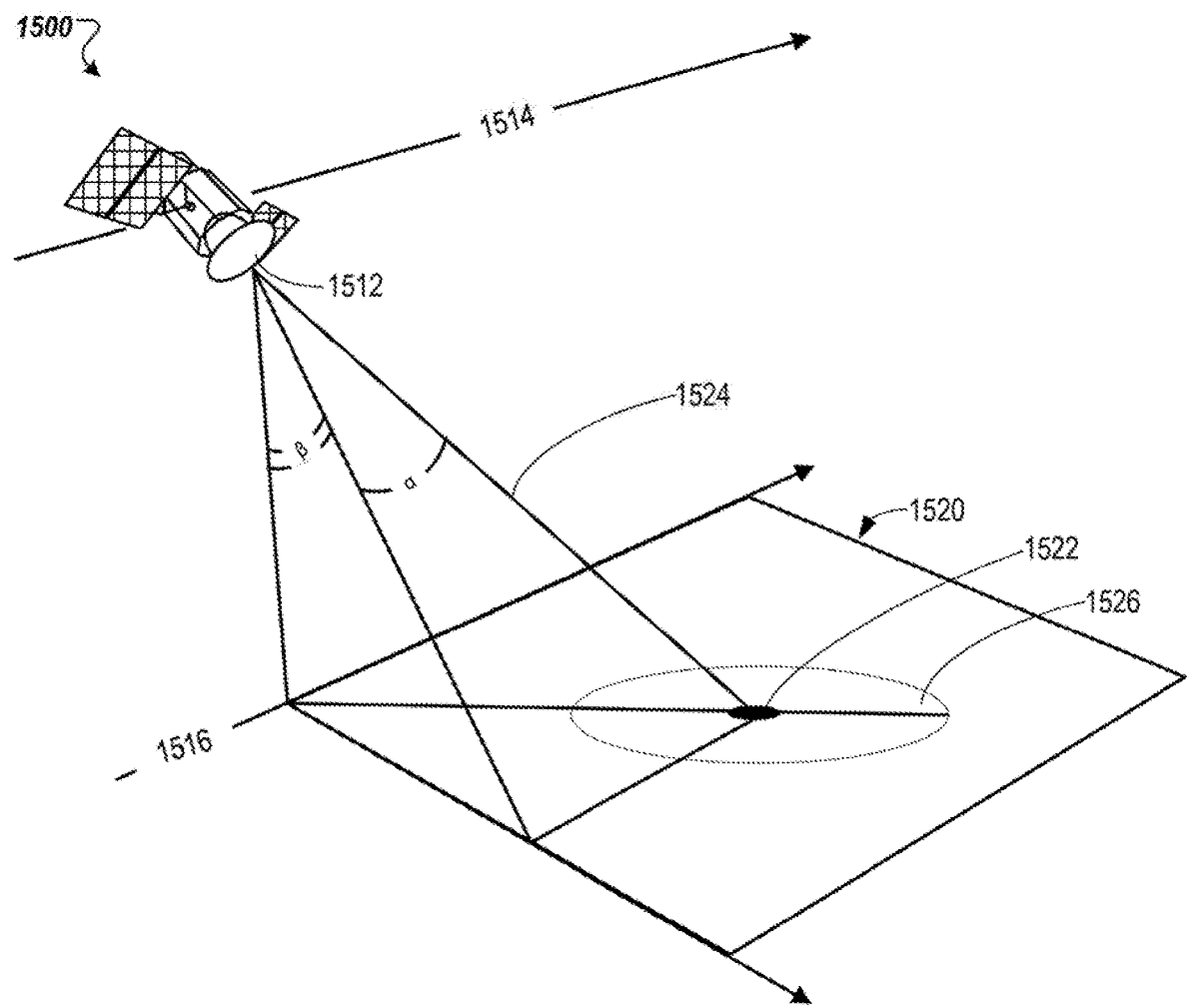
FIG. 15 illustrates the satellite including an antenna system that is steerable according to one embodiment.

FIG. 15 illustrates the satellite 1500 including an antenna system 1512 that is steerable according to one embodiment. The satellite 1500 is an example of a satellite 1302 of FIG. 13. The antenna system 1512 may include multiple antenna elements that form an antenna and that can be mechanically or electrically steered individually, collectively, or a combination thereof. In an example, the antenna is a phased array antenna.

In orbit 1304, the satellite 1500 follows a path 1514, the projection of which onto the surface of the Earth forms a ground path 1516. In the example illustrated in FIG. 15, the ground path 1516 and a projected axis extending orthogonally from the ground path 1516 at the position of the satellite 1500, together define a region 1520 of the surface of the Earth. In this example, the satellite 1500 is capable of establishing uplink and downlink communications with one or more of ground stations, user terminals, or other devices within the region 1520, including a ground station 1306 and a user terminal 1308 of FIG. 13. In some embodiments, the region 1520 may be located in a different relative position to the ground path 1516 and the position of the satellite 1500. For example, the region 1520 may describe a region of the surface of the Earth directly below the satellite 1500. Furthermore, embodiments may include communications between the satellite 1500, an airborne communications system, and so forth.

As shown in FIG. 15, a communication target 1522 (e.g., a ground station or a user terminal) is located within the region 1520. The satellite 1500 controls the antenna system 1512 to steer transmission and reception of communications signals to selectively communicate with the communication target 1522. For example, in a downlink transmission from the satellite 1500 to the communication target 1522, a signal beam 1524 emitted by the antenna system 1512 is steerable within an area 1526 of the region 1520. In some implementations, the signal beam 1524 may comprise a plurality of subbeams. The extents of the area 1526 define an angular range within which the signal beam 1524 is steerable, where the direction of the signal beam 1524 is described by a beam angle "α" relative to a surface normal vector of the antenna system 1512. In two-dimensional phased array antennas, the signal beam 1524 is steerable in two dimensions, described in FIG. 15 by a second angle "β" orthogonal to the beam angle α. In this way, the area 1526 is a two-dimensional area within the region 1520, rather than a linear track at a fixed angle determined by the orientation of the antenna system 1512 relative to the ground path 1516.

In FIG. 15, as the satellite 1500 follows the path 1514, the area 1526 tracks along the surface of the Earth. In this way, the communication target 1522, which is shown centered in the area 1526 for clarity, is within the angular range of the antenna system 1512 for a period of time. During that time, signals communicated between the satellite 1500 and the communication target 1522 are subject to bandwidth constraints, including but not limited to signal strength and calibration of the signal beam 1524. The signal strength can be measured by a SNR, which can be efficiently improved by implementing time-interleaved ADCs (such as the first ADC 102 and the second ADC 104 as described herein) to mitigate the effects of aliasing of received signals due to OOB blockers. In an example, for phased array antenna systems, the signal beam 1524 is generated by an array of mutually coupled antenna elements, wherein constructive and destructive interference produce a directional beam. Among other factors, phase drift, amplitude drift (e.g., of a transmitted signal in a transmitter array), and so forth affect the interference properties and thus the resultant directional beam or subbeam.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to convey the substance of their work most effectively to others skilled in the art. An algorithm is used herein, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "sending," "receiving," "scheduling," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but not limited to, any type of disk including floppy disks, optical disks, Read-Only Memories (ROMs), compact disc ROMs (CD-ROMs) and magnetic-optical disks, Random Access Memories (RAMs), EPROMs, EEPROMs, magnetic or optical cards, or any type of media suitable for storing electronic instructions.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the present embodiments as described herein. It should also be noted that the terms "when" or the phrase "in response to," as used herein, should be understood to indicate that there may be intervening time, intervening events, or both before the identified operation is performed.

It is to be understood that the above description is intended to be illustrative, and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A communication system comprising:
an analog anti-aliasing filter (AAF) circuit that receives signals;
a first analog-to-digital converter (ADC) coupled to an output terminal of the analog AAF circuit, wherein the first ADC generates first samples of the signals at a first sampling frequency;
a second ADC coupled to the output terminal of the analog AAF circuit, wherein the second ADC generates second samples of the signals at the first sampling frequency; and
a digital signal processing (DSP) circuit coupled to the first ADC and the second ADC, the DSP circuit comprising a DSP engine and logic circuitry, wherein:
the DSP circuit operates in a first mode or a second mode, the first mode being indicative of a single-channel mode of the communication system and the second mode being indicative of a multi-channel time-interleaved mode of the communication system;
in the first mode, the first ADC is enabled and the second ADC is disabled and the DSP engine processes the first samples; and
in the second mode,
the first ADC is enabled and the second ADC is enabled,
the logic circuitry generates intermediate samples at a second sampling frequency by combining the first samples and the second samples, the second sampling frequency being greater than the first sampling frequency,
the logic circuitry generates third samples at the first sampling frequency by down-sampling the intermediate samples, wherein aliased noise from an out-of-band (OOB) blocker signal is filtered out of the third samples, and
the DSP engine processes the third samples for scaling and phase alignment; and
a modem coupled to the DSP circuit, the modem to receive the third samples from the DSP engine and extract data from the third samples.

2. The communication system of claim 1, wherein the second sampling frequency is two times greater than the first sampling frequency; and
the logic circuitry further comprises a decimator that receives the intermediate samples and down-samples the intermediate samples into the third samples.

3. The communication system of claim 1, further comprising a clock generator circuit coupled to the first ADC and the second ADC, wherein the clock generator circuit generates a single clock signal, wherein the first ADC is configured to generate the first samples at first signal edges of the single clock signal and the second ADC is configured to generate the second samples at second signal edges of the single clock signal.

4. A receiver circuit comprising:
a first analog-to-digital converter (ADC);
a second ADC;
a status register that stores a first value that is indicative of a first mode or a second value that is indicative of a second mode; and
a digital processing circuit coupled to the first ADC and the second ADC, wherein the digital processing circuit is configured to operate in the first mode or the second mode, wherein:
in the first mode,
the first ADC is enabled and the second ADC is disabled,
the first ADC receives a first signal and generates first samples at a first sampling frequency, and
the digital processing circuit processes the first samples;
in the second mode,
the first ADC is enabled and the second ADC is enabled in response to the second value being stored in the status register,
the first ADC and the second ADC both receive a same second signal and collectively generate second samples at a second sampling frequency that is greater than the first sampling frequency, and
the digital processing circuit processes the second samples; and
the first mode is indicative of a single-channel mode of the receiver circuit and the second mode is indicative of a multi-channel time-interleaved mode of the receiver circuit.

5. The receiver circuit of claim 4, further comprising:
a receiver chain (RX chain) comprising an amplifier; and
an analog anti-aliasing filter (AAF) circuit coupled to the RX chain, the first ADC, and the second ADC, wherein the analog AAF circuit filters the first signal in the first mode and filters the second signal in the second mode.

6. The receiver circuit of claim 4, further comprising a clock generation circuit to generate a single clock signal, wherein:
the first ADC receives the single clock signal and is configured to sample at first signal edges of the single clock signal in the first mode and in the second mode; and
the second ADC receives the single clock signal and is configured to sample at second signal edges of the single clock signal in the second mode.

7. The receiver circuit of claim 4, further comprising a clock generation circuit to generate a first clock signal and a second clock signal, wherein:
the first ADC receives the first clock signal and is configured to sample at signal edges of the first clock signal in the first mode and in the second mode; and
the second ADC receives the second clock signal and is configured to sample at signal edges of the second clock signal in the second mode.

8. The receiver circuit of claim 4, wherein the digital processing circuit comprises:
a digital signal processing (DSP) engine that processes the first samples and the second samples at the first sampling frequency;
a portion of a first data path between the first ADC and the DSP engine in the first mode of the digital processing circuit;
a portion of a second data path between the DSP engine and both the first ADC and the second ADC in the second mode of the digital processing circuit; and
logic circuitry that is part of the second data path, the logic circuitry to receive the second samples, filter the second samples, and down-sample the second samples from the second sampling frequency to the first sampling frequency.

9. The receiver circuit of claim 4, wherein the digital processing circuit comprises:
   a first digital signal processing (DSP) engine that processes the first samples at the first sampling frequency;
   a second DSP engine that processes second samples at the second sampling frequency;
   a first data path operatively coupled to the first DSP engine in the first mode of the digital processing circuit; and
   a second data path operatively coupled to the second DSP engine in the second mode of the digital processing circuit.

10. The receiver circuit of claim 4, wherein the digital processing circuit comprises a mode-selection circuit that determines whether the digital processing circuit is operating in the first mode or the second mode and outputs, in the second mode, an enable signal to the second ADC such that the first ADC and the second ADC both receive the same second signal and collectively generate the second samples at the second sampling frequency.

11. The receiver circuit of claim 10, wherein the digital processing circuit further comprises:
   a digital signal processing (DSP) engine that processes the first samples and the second samples at the first sampling frequency; and
   data path circuitry coupled to the mode-selection circuit, wherein:
      the mode-selection circuit configures the data path circuitry to input the first samples from the first ADC into the DSP engine in the first mode of the digital processing circuit; and
      the mode-selection circuit configures the data path circuitry to combine samples from the first ADC and the second ADC into the second samples, filter the second samples, down-sample the second samples, and input the second samples into the DSP engine in the second mode of the digital processing circuit.

12. The receiver circuit of claim 4, wherein the digital processing circuit comprises a combiner, wherein the combiner, in the second mode, is configured to:
   receive third samples from the first ADC and fourth samples from the second ADC; and
   generate intermediate samples at the second sampling frequency by combining the third samples and the fourth samples, the second sampling frequency being two times greater than the first sampling frequency.

13. The receiver circuit of claim 12, wherein the digital processing circuit further comprises a decimator, wherein the decimator, in the second mode, is configured to:
   receive the intermediate samples from the combiner; and
   generate the second samples at the first sampling frequency by filtering and down-sampling the intermediate samples.

14. The receiver circuit of claim 4, wherein the digital processing circuit comprises:
   a first data buffer that stores the first samples in the first mode and stores third samples of the second signal in the second mode;
   a second data buffer that stores fourth samples of the second signal in the second mode; and
   a decimator to down-sample the third samples and the fourth samples in the second mode.

15. A communication system comprising:
   a radio frequency (RF) port; and
   a receiver circuit coupled to the RF port, the receiver circuit comprising:
      a first analog-to-digital converter (ADC);
      a second ADC; and
      a digital processing circuit coupled to the first ADC and the second ADC, the digital processing circuit comprising a mode-selection circuit and data path circuitry, wherein the digital processing circuit is configured to operate in a first mode or a second mode, wherein:
         in the first mode,
            the first ADC is enabled and the second ADC is disabled,
            the first ADC receives a first signal and generates first samples at a first sampling frequency,
            the mode-selection circuit configures the data path circuitry to input the first samples from the first ADC into the digital processing circuit, and
            the digital processing circuit processes the first samples at the first sampling frequency; and
         in the second mode,
            the first ADC is enabled and the second ADC is enabled,
            the first ADC and the second ADC both receive a same second signal and collectively generate second samples at a second sampling frequency that is greater than the first sampling frequency,
            the mode-selection circuit configures the data path circuitry to combine samples from the first ADC and the second ADC into the second samples, down-sample the second samples, and input the second samples into the digital processing circuit, and
            the digital processing circuit processes the second samples at the first sampling frequency.

16. The communication system of claim 15, wherein the receiver circuit further comprises:
   a receiver chain (RX chain) comprising an amplifier; and
   an analog anti-aliasing filter (AAF) circuit coupled to the RX chain, the first ADC, and the second ADC, wherein the analog AAF circuit filters the first signal in the first mode and filters the second signal in the second mode.

17. The communication system of claim 15, wherein the receiver circuit further comprises a clock generation circuit to generate a single clock signal, wherein:
   the first ADC receives the single clock signal and is configured to sample at first signal edges of the single clock signal in the first mode and in the second mode; and
   the second ADC receives the single clock signal and is configured to sample at second signal edges of the single clock signal in the second mode.

18. The communication system of claim 15, wherein the receiver circuit further comprises a clock generation circuit to generate a first clock signal and a second clock signal, wherein:
   the first ADC receives the first clock signal and is configured to sample at signal edges of the first clock signal in the first mode and in the second mode; and
   the second ADC receives the second clock signal and is configured to sample at signal edges of the second clock signal in the second mode.

19. The communication system of claim 15, wherein the digital processing circuit comprises:
   a digital signal processing (DSP) engine that processes the first samples and the second samples at the first sampling frequency, wherein the mode-selection circuit configures the data path circuitry further to filter the second samples and input the second samples into the DSP engine in the second mode.

* * * * *